(12) United States Patent
Sakai

(10) Patent No.: US 10,128,403 B2
(45) Date of Patent: Nov. 13, 2018

(54) SEMICONDUCTOR SUBSTRATE, SEMICONDUCTOR DEVICE, AND MANUFACTURING METHODS THEREOF

(71) Applicant: Seoul Viosys Co., Ltd., Ansan-si (KR)

(72) Inventor: Shiro Sakai, Tokushima (JP)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/640,585

(22) Filed: Jul. 3, 2017

(65) Prior Publication Data

US 2017/0338370 A1    Nov. 23, 2017

Related U.S. Application Data

(60) Continuation of application No. 15/213,746, filed on Jul. 19, 2016, now Pat. No. 9,773,940, which is a (Continued)

(30) Foreign Application Priority Data

Jun. 10, 2009  (JP) .................. 2009-139212
Jul. 15, 2009  (JP) .................. 2009-166682
Aug. 25, 2009  (JP) .................. 2009-194334

(51) Int. Cl.
*H01L 33/00* (2010.01)
*H01L 33/12* (2010.01)
(Continued)

(52) U.S. Cl.
CPC ........ *H01L 33/007* (2013.01); *H01L 21/0242* (2013.01); *H01L 21/0254* (2013.01); *H01L 21/0265* (2013.01); *H01L 21/02458* (2013.01); *H01L 21/02639* (2013.01); *H01L 21/02642* (2013.01); *H01L 21/02664* (2013.01); *H01L 33/0066* (2013.01); *H01L 33/0075* (2013.01); (Continued)

(58) Field of Classification Search
None
See application file for complete search history.

(56) References Cited

U.S. PATENT DOCUMENTS 6,024,884 A    2/2000  Bryant et al.
6,294,475 B1   9/2001  Schubert et al.
(Continued)

FOREIGN PATENT DOCUMENTS

CN    1378237      11/2002
CN    100341116    10/2007
(Continued)

OTHER PUBLICATIONS

Notice of Allowance issued for related U.S. Appl. No. 12/650,276 dated Jun. 25, 2012.
(Continued)

*Primary Examiner* — Benjamin Sandvik
(74) *Attorney, Agent, or Firm* — H.C. Park & Associates, PLC

(57) ABSTRACT

A method of manufacturing a semiconductor substrate including forming a first layer on a substrate, patterning the first layer to form a plurality of patterns spaced apart from one another, forming a second layer on the patterns to cover each of the patterns, heat-treating the second layer to form cavities in the patterns between the second layer and the substrate, and growing the second layer covering the cavities.

19 Claims, 25 Drawing Sheets

Related U.S. Application Data continuation of application No. 14/485,075, filed on Sep. 12, 2014, now Pat. No. 9,425,347, which is a division of application No. 12/801,455, filed on Jun. 9, 2010, now Pat. No. 8,860,183.

(51) Int. Cl.
*H01L 21/02* (2006.01)
*H01L 33/16* (2010.01)

(52) U.S. Cl.
CPC ......... *H01L 33/0079* (2013.01); *H01L 33/12* (2013.01); *H01L 33/16* (2013.01)

(56) References Cited

U.S. PATENT DOCUMENTS

| | | | |
|---|---|---|---|
| 7,101,444 | B2 | 9/2006 | Shchukin et al. |
| 7,118,934 | B2 | 10/2006 | Oshima et al. |
| 7,196,399 | B2 | 3/2007 | Usui et al. |
| 7,230,282 | B2 | 6/2007 | Shibata |
| 7,435,608 | B2 | 10/2008 | Shibata |
| 7,642,112 | B2 | 1/2010 | Atoji et al. |
| 8,026,119 | B2 | 9/2011 | Kim et al. |
| 8,053,811 | B2 | 11/2011 | Hiramatsu et al. |
| 2001/0053618 | A1 | 12/2001 | Kozaki et al. |
| 2002/0197825 | A1 | 12/2002 | Usui et al. |
| 2003/0017685 | A1 | 1/2003 | Usui et al. |
| 2003/0047746 | A1 | 3/2003 | Kuniyasu et al. |
| 2003/0143771 | A1 | 7/2003 | Kidoguchi et al. |
| 2003/0183157 | A1 | 10/2003 | Usui et al. |
| 2004/0021147 | A1 | 2/2004 | Ishibashi et al. |
| 2004/0206967 | A1 | 10/2004 | Oshima et al. |
| 2004/0209442 | A1 | 10/2004 | Takakuwa et al. |
| 2005/0077512 | A1 | 4/2005 | Yoon et al. |
| 2005/0194564 | A1 | 9/2005 | Fujita et al. |
| 2006/0006408 | A1 | 1/2006 | Suehiro et al. |
| 2006/0046511 | A1 | 3/2006 | Shibata et al. |
| 2006/0151797 | A1 | 7/2006 | Park |
| 2006/0151801 | A1 | 7/2006 | Doan et al. |
| 2008/0014723 | A1 | 1/2008 | Shibata |
| 2008/0076355 | A1 | 3/2008 | Albrecht et al. |
| 2008/0124939 | A1 | 5/2008 | Semkow et al. |
| 2008/0191226 | A1 | 8/2008 | Urashima |
| 2008/0251803 | A1 | 10/2008 | Cho et al. |
| 2008/0296586 | A1 | 12/2008 | Francis et al. |
| 2009/0053845 | A1 | 2/2009 | Wong et al. |
| 2009/0085165 | A1 | 4/2009 | Hiramatsu et al. |
| 2009/0093122 | A1 | 4/2009 | Ueda et al. |
| 2009/0098677 | A1 | 4/2009 | Shibata |
| 2009/0117711 | A1 | 5/2009 | Harle et al. |
| 2009/0243074 | A1 | 10/2009 | Ramiah et al. |
| 2009/0290610 | A1 | 11/2009 | Eichler et al. |
| 2010/0015739 | A1 | 2/2010 | Park |
| 2010/0026779 | A1 | 2/2010 | Yonehara et al. |
| 2010/0109019 | A1 | 5/2010 | Yonehara |
| 2010/0139758 | A1 | 6/2010 | Chang et al. |
| 2010/0219436 | A1 | 9/2010 | Watanabe |
| 2010/0252859 | A1 | 10/2010 | Son |
| 2010/0314661 | A1 | 12/2010 | Sakai |
| 2010/0320506 | A1 | 12/2010 | Varangis et al. |
| 2011/0053303 | A1 | 3/2011 | Kim et al. |

FOREIGN PATENT DOCUMENTS

| | | |
|---|---|---|
| CN | 101180710 | 5/2008 |
| CN | 101253660 | 8/2008 |
| CN | 101477943 | 7/2009 |
| JP | 2003-055097 | 2/2003 |
| JP | 20040266624 | 1/2004 |
| JP | 2005057220 | 3/2005 |
| JP | 2005064247 | 3/2005 |
| JP | 2005085851 | 3/2005 |
| KR | 1020020010583 | 2/2002 |
| KR | 1020030030019 | 4/2003 |
| KR | 1020030032965 | 4/2003 |
| KR | 1020050035565 | 4/2005 |
| KR | 1020060081107 | 7/2006 |
| KR | 1020060135568 | 12/2006 |
| KR | 1020070005984 | 1/2007 |
| KR | 1020070009854 | 1/2007 |
| KR | 1020070101424 | 10/2007 |
| KR | 1020080093222 | 10/2008 |
| KR | 1020080100466 | 11/2008 |
| WO | 398710 | 11/2003 |
| WO | 2007/025497 | 3/2007 |
| WO | 2011/099772 | 11/2011 |

OTHER PUBLICATIONS

Final Office Action of U.S. Appl. No. 12/650,276 dated Apr. 12, 2012.
Final Office Action of U.S. Appl. No. 12/929,712 dated Apr. 5, 2012.
Notice of Allowance of U.S. Appl. No. 13/137,124 dated Feb. 6, 2012.
Non-Final Office Action of U.S. Appl. No. 13/137,124 dated Nov. 25, 2011.
Non-Final Office Action of U.S. Appl. No. 12/650,276 dated Nov. 10, 2011.
Non-Final Office Action of U.S. Appl. No. 12/929,712 dated Dec. 2, 2011.
International Search Report dated Sep. 28, 2011, corresponding to International Application No. PCT/KR2011/000871.
Notice of Allowance dated May 27, 2011 issued for related co-pending U.S. Appl. No. 12/805,958.
Notice of Allowance of U.S. Appl. No. 12/805,958 dated Feb. 25, 2011.
PCT Search Report of PCT/KR2010/004816 dated Feb. 24, 2011, corresponding to U.S. Appl. No. 12/509,958.
International Search Report of PCT/KR2010/003724 dated Jan. 14, 2011, corresponding to U.S. Appl. No. 12/801,455.
Written Opinion of PCT/KR2010/003724 dated Jan. 14, 2011, corresponding to U.S. Appl. No. 12/801,455.
Haino et al., "Buried Tungsten Metal Structure Fabricated by Epitaxial-Lateral-Overgrown GaN via Low-Pressure Metalorganic Vapor Phase Epitaxy," Japan Journal of Applied Physics, vol. 39, 2000, pp. 449-452.
Hasegawa et al., "Polycrystalline GaN for light emitter and field electron emitter applications," Thin Solid Films 487 (2005), pp. 260-267.
Notice of Allowance of U.S. Appl. No. 13/506,295 dated Jul. 25, 2012.
Non-Final Office Action of U.S. Appl. No. 12/301,455 dated Aug. 29, 2012.
Non-Final Office Action of U.S. Appl. No. 12/875,649 dated Oct. 4, 2012.
Final Office Action of U.S. Appl. No. 12/801,455 dated Nov. 23, 2012.
Non-Final Office Action of U.S. Appl. No. 12/929,712 dated Nov. 28, 2012.
Notice of Allowance of U.S. Appl. No. 12/929,712 dated Mar. 5, 2013.
Final Office Action issued to U.S. Appl. No. 12/875,649 dated Apr. 5, 2013.
Non-Final Office Action dated Feb. 14, 2014 in U.S. Appl. No. 12/801,455.
Extended European Search Report dated Feb. 5, 2014 in European Patent Application No. 10 78 6378.
Extended European Search Report dated Feb. 7, 2014 in European Patent Application No. 13 19 6846.
Wolf S., et al., "Chapter 5: Contamination control and cleaning technology for ULSI", Silicon Processing for the VLSI Era, vol. 1., pp. 119-148, CA, US.
Walker, et al., "Handbook of Metal Etchants", CRC Press LLC, 1991, pp. 1252-1261.
Final Office Action dated May 6, 2014 in U.S. Appl. No. 13/507,210.
Notice of Allowance dated Jun. 13, 2014 in U.S. Appl. No. 12/801,455.

(56) References Cited

OTHER PUBLICATIONS

Chinese Office Action dated Oct. 10, 2014 in CN Application No, 201160009076.5.
Translation of Office Action dated Jan. 15, 2015, in Chinese Patent Application 201310063858.8.
Non-Final Office Action dated Jun. 23, 2015, in U.S. Appl. No. 13/694,749.
Non-Final Office Action dated Aug. 4, 2015, in U.S. Appl. No. 14/485,075.
Final Office Action dated Nov. 13, 2015, in U.S. Appl. No. 14/485,075.
Notice of Allowance dated Apr. 29, 2016, in U.S. Appl. No. 14/485,075.
Non-Final Office Action dated Jan. 13, 2017, in U.S. Appl. No. 15/213,746.
Notice of Allowance dated Jun. 7, 2017, in U.S. Appl. No. 15/213,746.

[Fig. 2]
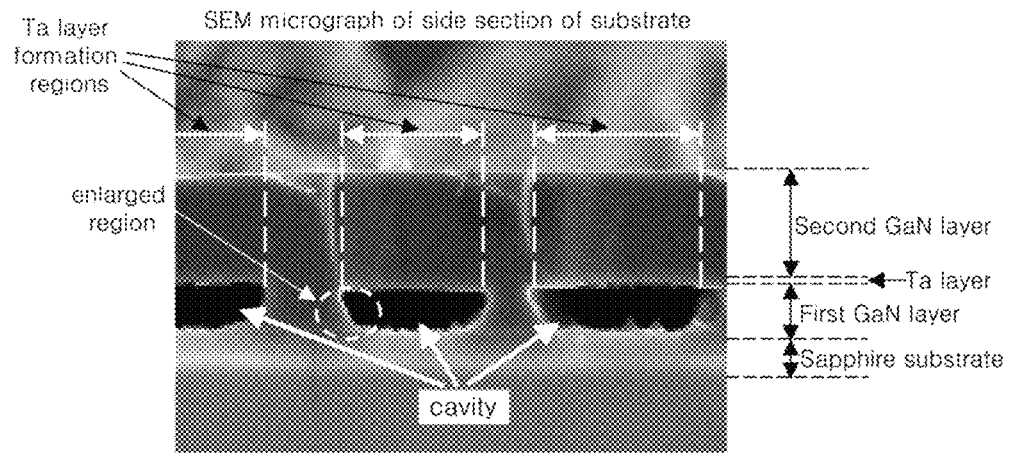
[Fig. 3]
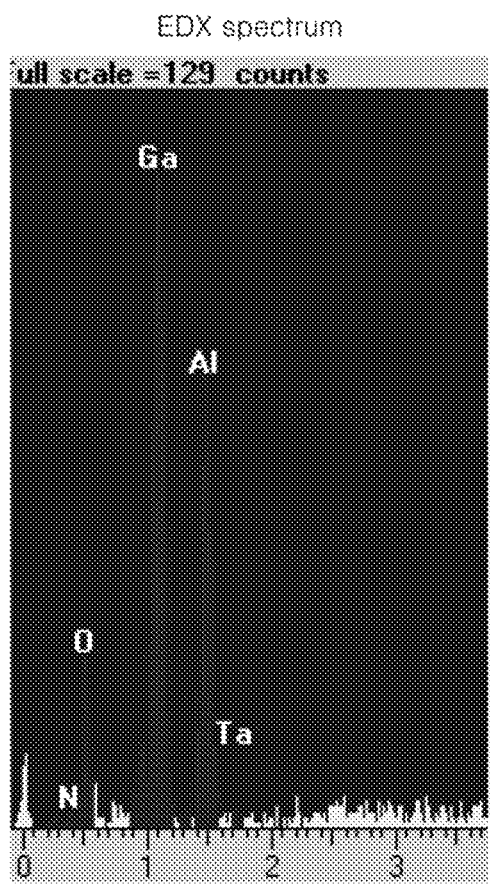

[Fig. 11]
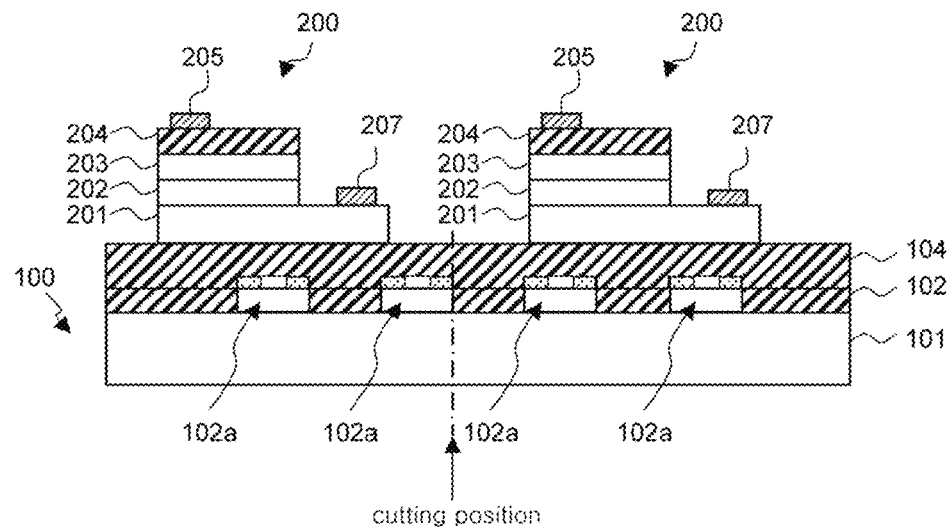
[Fig. 12]
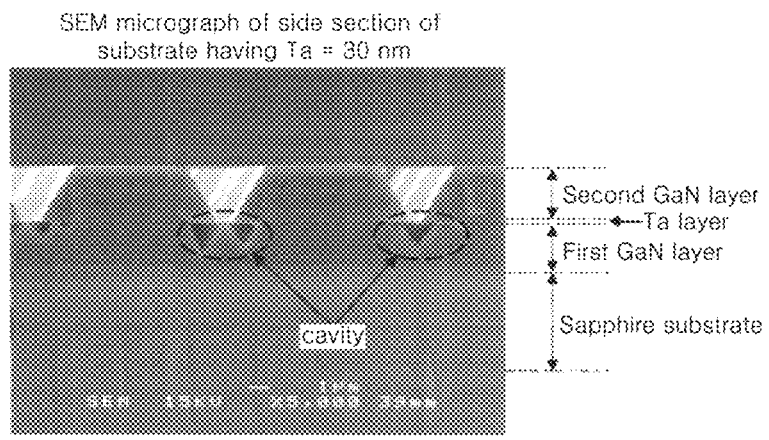
[Fig. 13]
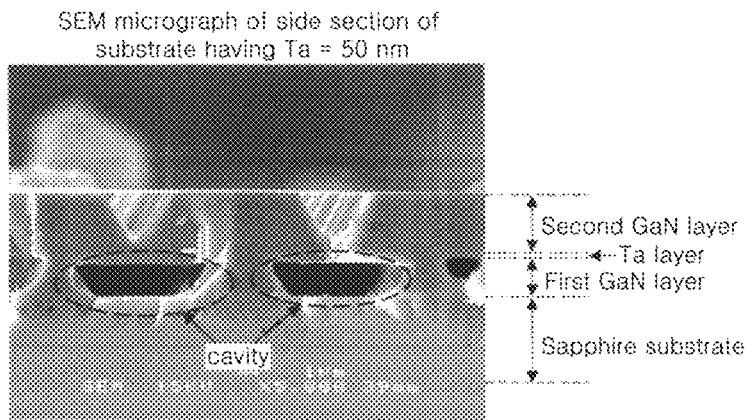

SEM micrograph of side section of substrate having Ta = 100 nm (A) Example of GaN layer having 5 nm thick Ta layer thereon (B) Example of GaN layer having 100 nm thick Ta layer thereon

[Fig. 20]
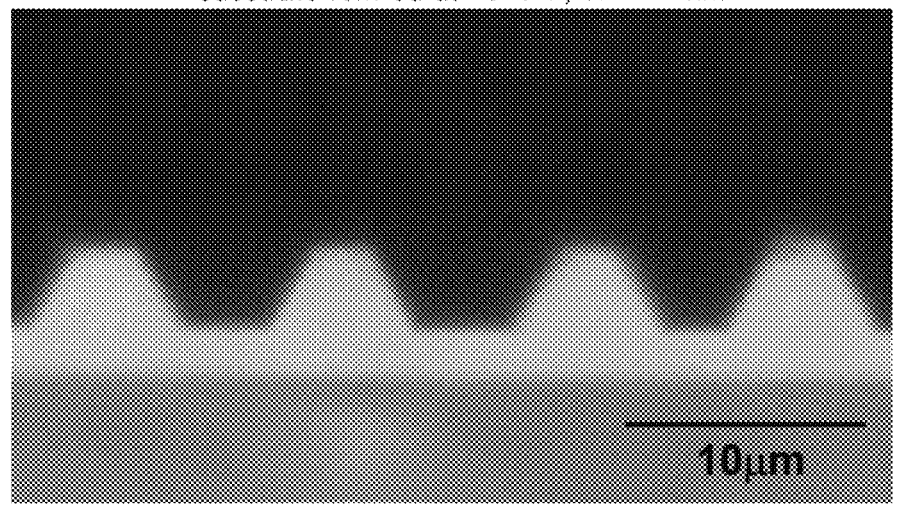
[Fig. 21]
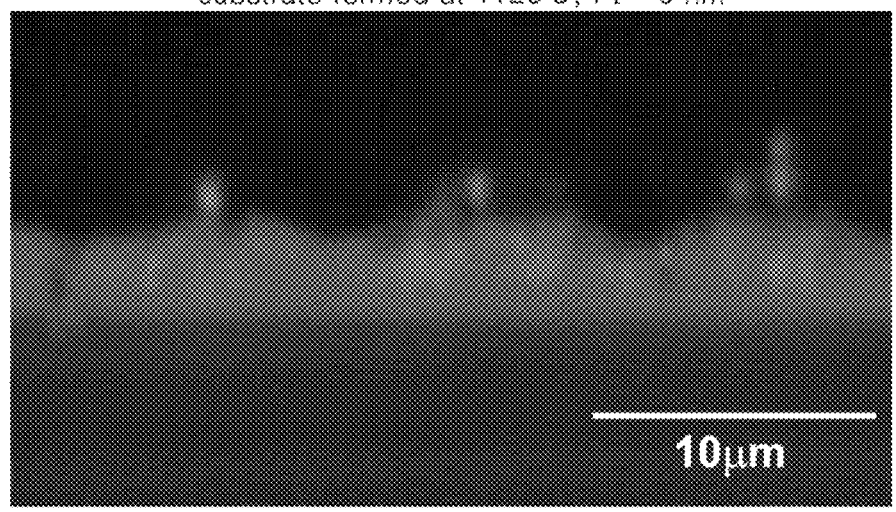

[Fig. 22]
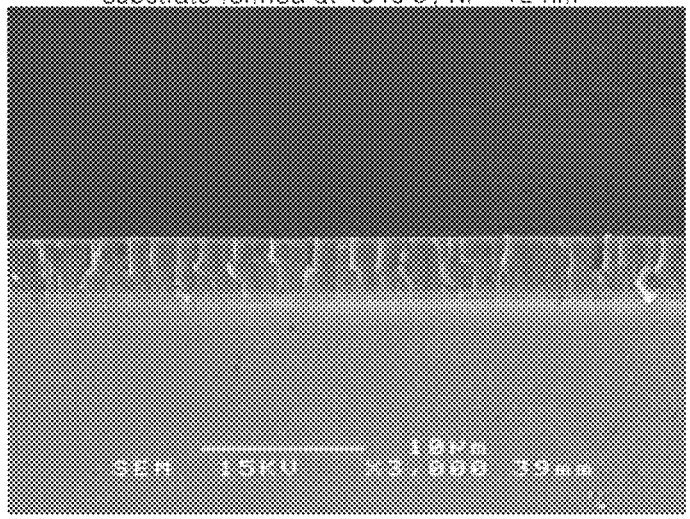
SEM micrograph of side section of substrate formed at 1045°C, Ni = 12 nm
[Fig. 23]
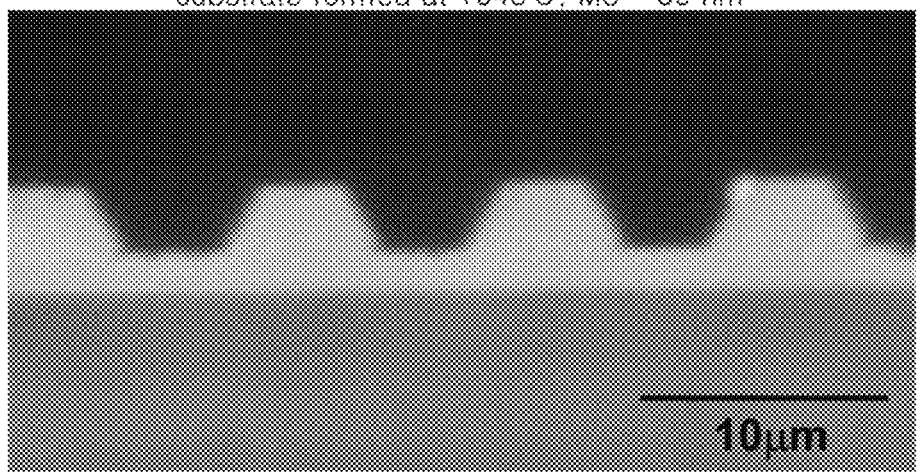
SEM micrograph of side section of substrate formed at 1045°C, Mo = 30 nm FIG 24A-A
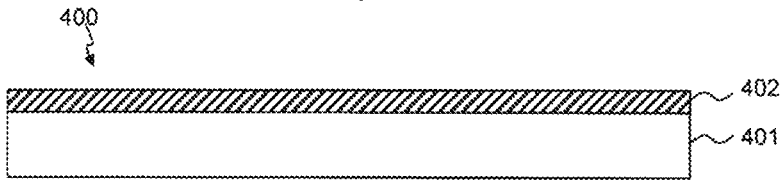
FIG. 24A-B
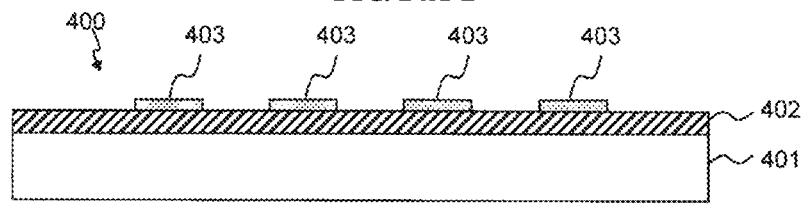
FIG. 24A-C
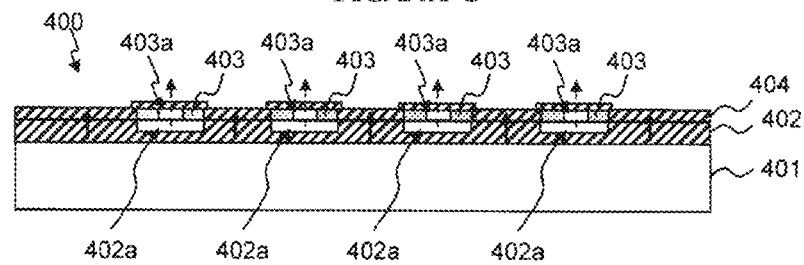
FIG. 24A-D
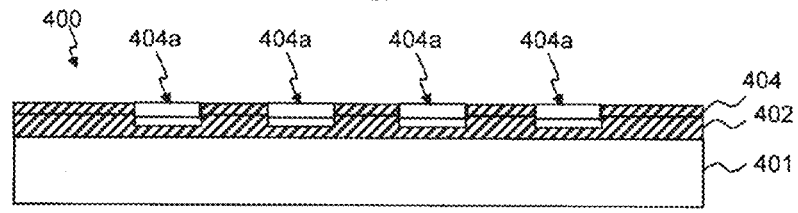
FIG. 24A-E
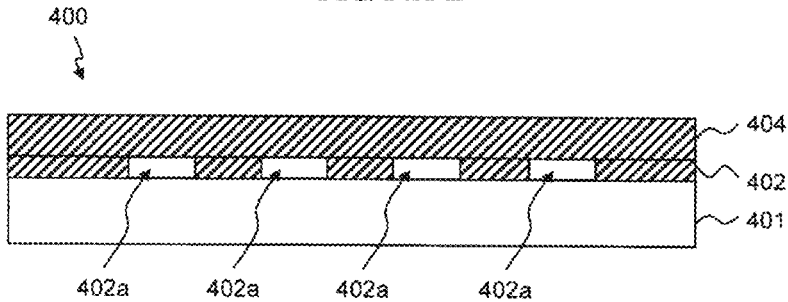

FIG 24B-A
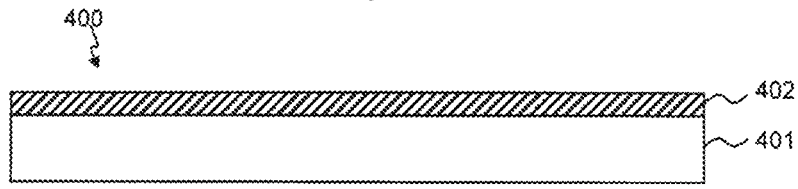
FIG. 24B-B
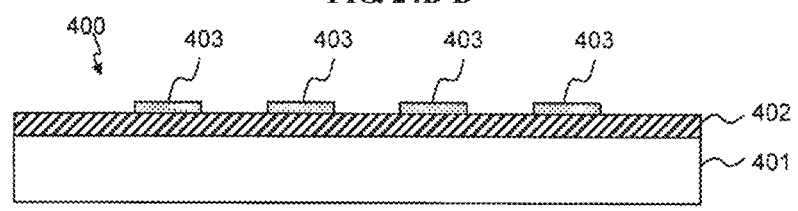
FIG. 24B -C
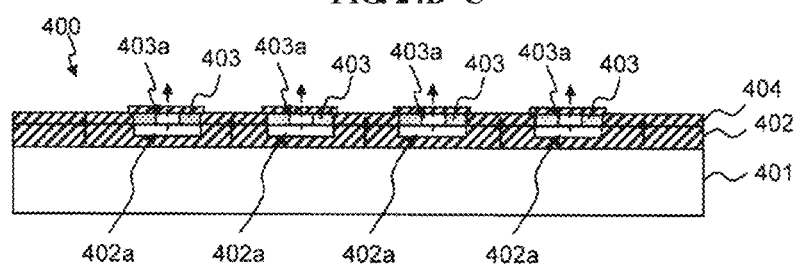
FIG. 24B-D
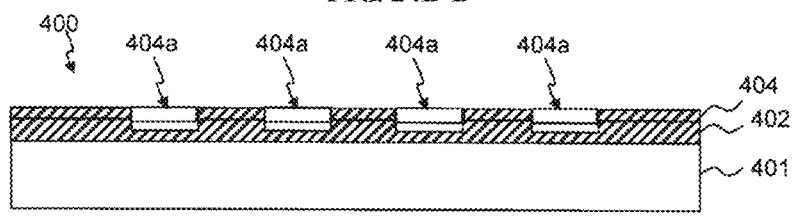
FIG. 24B-E
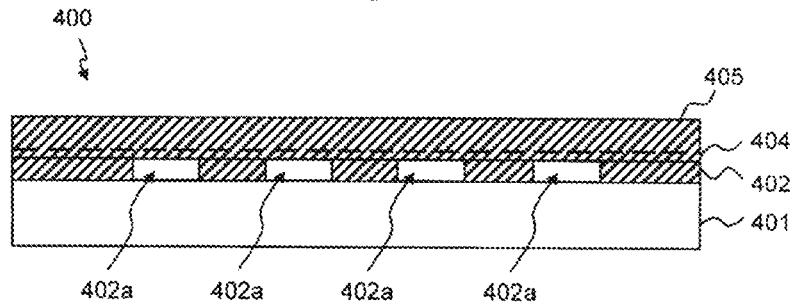

FIG. 25A-A
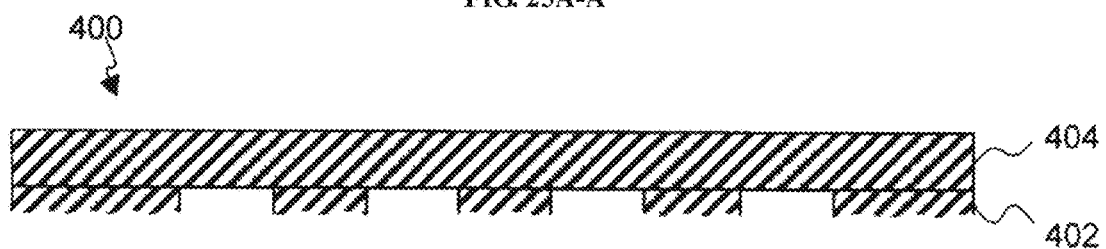
FIG. 25A-B

FIG. 25B-A
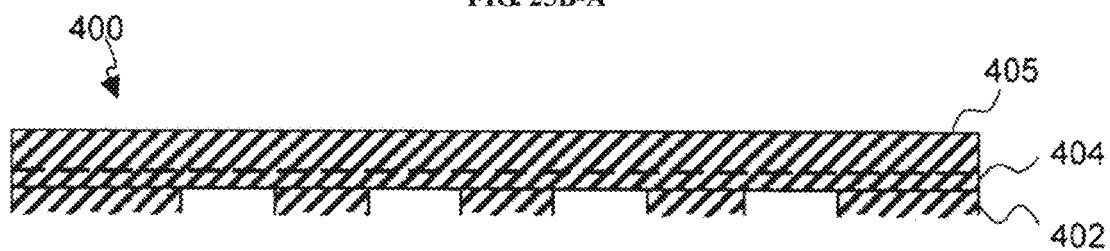
FIG. 25B-B

SEMICONDUCTOR SUBSTRATE, SEMICONDUCTOR DEVICE, AND MANUFACTURING METHODS THEREOF

CROSS-REFERENCE TO RELATED APPLICATIONS

This application is a continuation of U.S. patent application Ser. No. 15/213,746, filed on Jul. 19, 2016, which is a continuation of U.S. patent application Ser. No. 14/485,075, filed on Sep. 12, 2014, now issued as U.S. Pat. No. 9,425,347, which is a divisional of U.S. patent application Ser. No. 12/801,455, filed on Jun. 9, 2010, now issued as U.S. Pat. No. 8,860,183, and claims priority from and the benefit of Japanese Patent Application No. 2009-139212, filed on Jun. 10, 2009, Japanese Patent Application No. 2009-166682, filed on Jul. 15, 2009, and Japanese Patent Application No. 2009-194334, filed on Aug. 25, 2009, all of which are hereby incorporated by reference for all purposes as if fully set forth herein.

BACKGROUND OF THE INVENTION

Field of the Invention

The present disclosure relates to semiconductor substrates, semiconductor devices, and manufacturing methods thereof. More particularly, the present disclosure relates to semiconductor substrates having a GaN layer formed on a substrate, semiconductor devices, and manufacturing methods thereof Discussion of the Background A light emitting diode (LED) that has a gallium nitride (GaN) based semiconductor may be used for various applications, such as signal devices, backlight units for liquid crystal panels, and the like. It is known that light emitting efficiency of LEDs is affected by dislocation density and defects in a crystal. Although GaN-based semiconductor crystals may be grown on a heterogeneous substrate, such as sapphire or the like, lattice mismatch and differences in thermal expansion between the GaN layer and the substrate may occur, causing a high dislocation density or an increase in defect density.

The crystal growth of a GaN-based semiconductor may be carried out on a homogeneous substrate, such as a GaN substrate and the like. However, a high dissociation rate of nitrogen in GaN may obstruct formation of a GaN melt, thereby making it difficult to form a GaN substrate. Although mechanical polishing, laser delamination or the like may be used to separate the GaN substrate from a GaN bulk crystal grown for the GaN substrate, it may be difficult to produce a GaN substrate having a practical size. Particularly, the laser delamination may require a significantly long period of time to perform and cause an increase in the cost of the GaN substrate.

GaN crystal growth is shown and described in "Polycrystalline GaN for light emitter and field electron emitter applications," by S. Hasegawa, S. Nishida, T. Yamashita, H. Asahi, (Thin Solid Films 487 (2005), pp 260-267) (hereinafter "Hasegawa, et al."), and "Buried Tungsten Metal Structure Fabricated by Epitaxial-Lateral-Overgrown GaN via Low-Pressure Metalorganic Vapor Phase Epitaxy," M. Haino, et al., (Jpn. J. Appl. Phys., 39 (2000) L449) (hereinafter "Haino, et. al."), which are hereby incorporated by reference in their entirety for all purposes as if fully set forth herein. For example, GaN crystals are respectively grown on quartz substrates, high-melting-point metal substrates of Tungsten (W), Molybdenum (Mo), Tantalum (Ta), and Niobium (Nb), and Silicon (Si) substrates using plasma assisted molecular beam epitaxy.

Since it may be difficult and costly to fabricate the GaN substrate, semiconductor devices such as LEDs or laser diodes are generally manufactured by growing a GaN layer on a heterogeneous substrate, such as sapphire and the like. However, as mentioned above, the high dislocation density or the increase in defect density may degrade the light emitting efficiency of the LED. In addition, the sapphire substrate has a lower thermal conductivity than the GaN substrate, and may cause deterioration in heat dissipation properties of a device. Thus, the use of a sapphire substrate for LEDs or laser diodes may limit the operational lifespan thereof.

SUMMARY OF THE INVENTION

The present invention provides a method of manufacturing a flat and easily separable GaN substrate on a heterogeneous substrate at low cost.

The present invention also provides a semiconductor device manufactured using the GaN substrate which may have improved performance or long operational lifespan.

Additional features of the invention will be set forth in the description which follows, and in part will be apparent from the description, or may be learned by practice of the invention.

The present invention discloses a method of manufacturing a semiconductor substrate including forming a first semiconductor layer on a substrate, forming a metallic material layer on the first semiconductor layer, forming a first portion of a second semiconductor layer on the first semiconductor layer and the metallic material layer, removing the metallic material layer under the first portion of the second semiconductor layer by dipping the substrate in a solution, forming a second portion of the second semiconductor layer on the first portion of the second semiconductor layer, and forming a cavity entirely through a portion of the first semiconductor layer located under where the metallic material layer was removed.

The present invention also discloses a method of manufacturing a semiconductor substrate including forming a first layer on a substrate, patterning the first layer to form a plurality of patterns spaced apart from one another, forming a second layer on the patterns to cover each of the patterns, heat-treating the second layer to form cavities in the patterns between the second layer and the substrate, and growing the second layer covering the cavities.

Heat-treating the second layer may include heat-treating the second layer at a temperature greater than 900° C.

Forming the second layer may include covering the entire upper surface of each of the patterns.

The second layer may further include at least one of gallium and nitrogen.

The second layer may further include aluminum.

The substrate may include at least one of a sapphire substrate and a silicon-based substrate.

A cross-sectional view of the patterns may have substantially a semi-spherical shape.

The first layer may include at least one of titanium and tantalum.

The first layer further may include oxygen.

The cavities may be formed directly on the substrate.

At least portions of the patterns may evaporate through a first portion of the second layer.

Heat-treating the second layer may crystalize the second layer at a first temperature.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 1A-1F are flow diagrams of a method of manufacturing a semiconductor substrate in accordance with a first exemplary embodiment of the present invention, in which FIG. 1A is a sectional view of a process of forming a first GaN layer, FIG. 1B is a sectional view of a process of forming a Ta layer, FIG. 1C is a sectional view of a process of forming a second GaN layer and a cavity, FIG. 1D is a sectional view of the semiconductor substrate after forming the second GaN layer, FIG. 1E is a sectional view of the semiconductor substrate from which a sapphire substrate is separated, and FIG. 1F is a sectional view of a finished GaN substrate.

FIG. 2 is a scanning electron microscope (SEM) image of a semiconductor substrate of a first example of the first exemplary embodiment.

FIG. 3 is an energy dispersive x-ray spectrometer (EDX) spectrum of the semiconductor substrate of the first example of the first exemplary embodiment.

FIGS. 4A-4D are SEM micrograph and EDX diagrams of the semiconductor substrate according to the first example of the first exemplary embodiment, in which FIG. 4A is a SEM micrograph of an enlarged region shown in FIG. 2, FIG. 4B is an EDX diagram of Ga, FIG. 4C is an EDX diagram of Al, and FIG. 4D is an EDX diagram of O.

FIGS. 5A and 5B are SEM micrographs of the semiconductor substrate according to the first example of the first exemplary embodiment, in which FIG. 5A is a SEM micrograph of a side section of the semiconductor substrate and FIG. 5B is a SEM micrograph of a surface of the semiconductor substrate.

FIGS. 6A and 6B are EDX diagrams of the semiconductor substrate according to the first example of the first exemplary embodiment, in which FIG. 6A is an EDX diagram of Ga and FIG. 6B is an EDX diagram of Ta.

FIGS. 7A and 7B are SEM micrographs of a semiconductor substrate according to a first comparative example, in which FIG. 7A is a SEM micrograph of the semiconductor substrate and FIG. 7B is a SEM micrograph of a surface of the semiconductor substrate.

FIGS. 8A-8C are an EDX spectrum and EDX diagrams of the semiconductor substrate according to the first comparative example, in which FIG. 8A is an EDX spectrum of the semiconductor substrate of FIG. 7B, FIG. 8B is an EDX diagram of Ga of FIG. 7B, and FIG. 8C is an EDX diagram of N of FIG. 7B.

FIGS. 9A and 9B are a SEM micrograph and an EDX spectrum of the semiconductor substrate according to the first comparative example, in which FIG. 9A is a SEM micrograph of a side section of a void and FIG. 9B is an EDX spectrum of the void of FIG. 9A.

FIGS. 10A-10C are EDX diagrams of the semiconductor substrate according to the first comparative example, in which FIG. 10A is an EDX diagram of Ga of FIG. 9A, FIG. 10B is an EDX diagram of N of FIG. 9A, and FIG. 10C is an EDX diagram of Ta of FIG. 9A.

FIG. 11 is a sectional view of an LED array in accordance with a fourth exemplary embodiment of the present invention.

FIG. 12 is a SEM micrograph of a side section of a semiconductor substrate according to a second example of the first exemplary embodiment.

FIG. 13 is a SEM micrograph of a side section of a semiconductor substrate of according to a third example of the first exemplary embodiment.

FIGS. 17A-17F are flow diagrams of a method of manufacturing a semiconductor substrate in accordance with a second exemplary embodiment, in which Figure 17A is a sectional view of a process of forming a first GaN layer, FIG. 17B is a sectional view of a process of forming a Ta layer, FIG. 17C is a sectional view of a process of forming a second GaN layer and a cavity, FIG. 17D is a sectional view of the semiconductor substrate after forming the second GaN layer, FIG. 17E is a sectional view of the semiconductor substrate from which a sapphire substrate is separated, and FIG. 17F is a sectional view of a finished GaN substrate.

FIG. 20 is a SEM micrograph of a side section of a semiconductor substrate formed using a tungsten (W) layer according to a second comparative example.

FIG. 21 is a SEM micrograph of a side section of a semiconductor substrate formed using a plutonium (Pt) layer according to a second comparative example.

FIG. 22 is a SEM micrograph of a side section of a semiconductor substrate formed using a nickel (Ni) layer according to a second comparative example.

FIG. 23 is a SEM micrograph of a side section of a semiconductor substrate formed using a molybdenum (Mo) layer according to a second comparative example.

FIGS. 24A-A-24A-E are a flow diagrams of a method of manufacturing a semiconductor substrate in accordance with a third exemplary embodiment, in which Figure 24A-A is a sectional view of a process of forming a first GaN layer, FIG. 24A-B is a sectional view of a process of forming a Ta layer, FIG. 24A-C is a sectional view of a process of forming a second GaN layer and a cavity, FIG. 24A-D is a sectional view of the second GaN layer after removing the Ta layer by ultrasound cleaning, and FIG. 24A-E is a sectional view of a finished second GaN substrate.

FIG. 24B-A-24B-E are flow diagrams of a method of manufacturing a semiconductor substrate in accordance with a third exemplary embodiment, in which FIG. 24B-A is a sectional view of a process of forming a first GaN layer, FIG. 24B-B is a sectional view of a process of forming a Ta layer, FIG. 24B-C is a sectional view of a process of forming a second GaN layer and a cavity, FIG. 24B-D is a sectional view of the second GaN layer after removing the Ta layer by ultrasound cleaning, and FIG. 24B-E is a sectional view of a finished third GaN substrate.

FIG. 25A-A and 25A-B are flow diagrams of the method of manufacturing a semiconductor substrate in accordance with the third exemplary embodiment continuing from FIGS. 24A-A-24A-E, in which FIG. 25A-A is a sectional view of the semiconductor substrate from which the sapphire substrate is separated and FIG. 25A-B is a sectional view of a finished GaN substrate.

FIG. 25B-A and 25B-B are flow diagrams of the method of manufacturing a semiconductor substrate in accordance with the third exemplary embodiment continuing from FIG. 24B, in which FIG. 25B-A is a sectional view of the semiconductor substrate from which the sapphire substrate is separated and FIG. 25B-B is a sectional view of a finished GaN substrate.

FIGS. 29A-29D are sectional views of the semiconductor substrate formed by the method in accordance with the third exemplary embodiment, in which FIG. 29A shows TMG density and a grown state of the GaN layer when the first GaN layers are separated a narrow distance from each other and an internal pressure of an MOCVD apparatus is low, FIG. 29B shows TMG density and a grown state of the GaN layer when the first GaN layers are separated a wide distance from each other and the internal pressure of the MOCVD apparatus is high, Figure C shows TMG density and a grown state of the GaN layer when the first GaN layers are separated a narrow distance from each other and the internal pressure of the MOCVD apparatus is high, and FIG. 29D shows TMG density and a grown state of the GaN layer when the first GaN layers are separated a wide distance from each other and the internal pressure of the MOCVD apparatus is low.

DETAILED DESCRIPTION OF THE ILLUSTRATED EMBODIMENTS

Figure 1A:
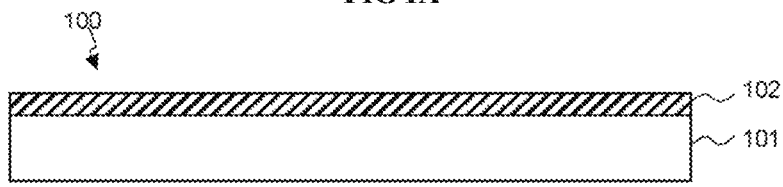

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 1B:
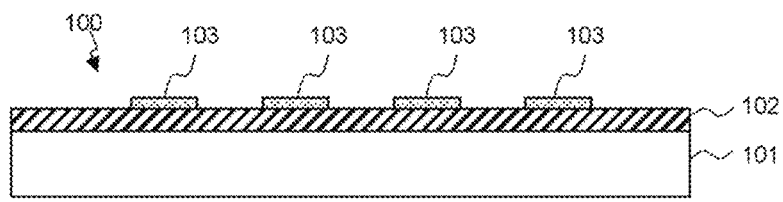
Figure 1C:
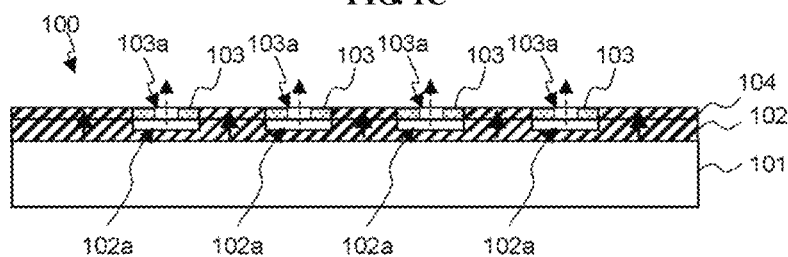
Figure 1D:
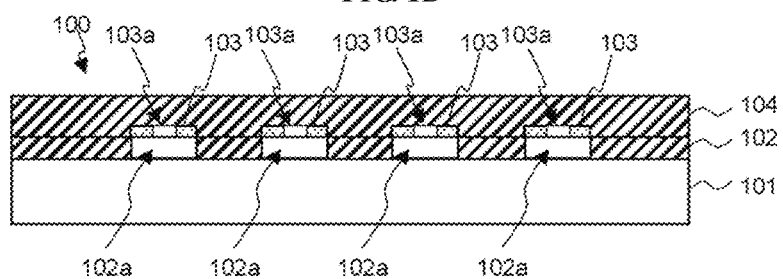
Figure 1E:
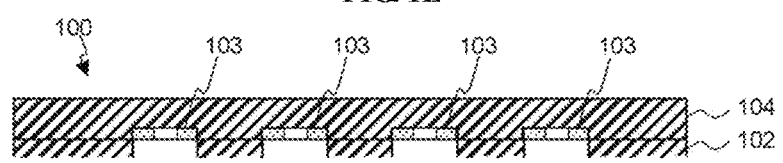
Figure 1F:

FIGS. 1A-1F are flow diagrams of a method of manufacturing a semiconductor substrate 100 in accordance with a first exemplary embodiment. FIG. 1A is a sectional view of a process of forming a first GaN layer, FIG. 1B is a sectional view of a process of forming a Ta layer, FIG. 1C is a sectional view of a process of forming a second GaN layer and a cavity, FIG. 1D is a sectional view of the semiconductor substrate after forming the second GaN layer, FIG. 1E is a sectional view of the semiconductor substrate from which a sapphire substrate is separated, and FIG. 1F is a sectional view of a finished GaN substrate.

Referring to FIG. 1A, reference numeral 101 indicates a sapphire ($Al_2O_3$) substrate. First, a first GaN layer 102 having a thickness of about 2 μm is formed on the sapphire substrate 101. This thickness of the first GaN layer 102 is provided as an example.

Next, referring to FIG. 1B, a Ta layer (metallic material layer) 103 having a thickness of about 50 nm is formed in a shape of stripes, which have a width of 5 μm and are separated at a distance of 5 μm from each other, on the first GaN layer 102 by electron beam (EB) deposition and lift-off. The shape, thickness, width, distance of the Ta layer 103 are provided as an example.

Referring to FIG. 1C, a second GaN layer 104 is formed on the first GaN layer 102 and the Ta layer 103 by metal organic chemical vapor deposition (MOCVD). The first GaN layer 102 and the second GaN layer 104 may include different semiconductor material such as AlGaN, InGaN, or AlInGaN. FIG. 1C shows the second GaN layer 104 during formation thereof. In the present exemplary embodiment, N in the first GaN layer 102 combine with Ta to form TaN, which acts as foreign matter and rises towards a vapor having a higher density of N. The TaN becomes unstable at 900° C. or more, and a hole 103l is deepened to form a cavity 102a depending on the degree of instability. Here, although N in the first GaN layer 102 becomes TaN, Ga remains in the first GaN layer 102. Since this Ga remaining in the first GaN layer 102 is the same as Ga deposited during the vapor deposition, it is used as the raw material. However, GaN may also be grown on a Ta film. As disclosed in Hasegawa, et al., there is a possibility that the surface of the Ta layer 103 becomes not only Ta, but also $Ta_2O_5$ in a reaction with air.

Next, referring to FIG. 1D, once the formation of the second GaN layer 104 is completed, the semiconductor substrate 100 is formed. While the second GaN layer 104 is formed by MOCVD, a portion of the first GaN layer 102 under the Ta layer 103 is removed by etching and a formation region of the cavity 102a is extended substantially to the sapphire substrate 101. Further, the surface of the substrate is flattened to progress the growth of the first GaN layer 102 along with the growth of the second GaN layer 104, as shown in FIG. 1.

Next, referring to FIG. 1E, the sapphire substrate 101 is separated from the first GaN layer 102. Then, referring to FIG. 1F, the GaN substrate 100 may be obtained by polishing the first GaN layer 102, from which the sapphire substrate is removed. The GaN substrate 100 may be used as a semiconductor substrate for manufacturing a device by attaching a silicon-based substrate such as Si or SiC to an upper side of the GaN substrate 100 and flattening a lower surface thereof. Furthermore, the cavity 102a formed in the first GaN layer 102 may be used to separate the sapphire substrate 101. Separation of the sapphire substrate 101 may also be performed by, for example, a laser lift-off or polishing process. The sapphire substrate 101 may be separated from the first GaN layer 102 using any suitable method.

As such, when the semiconductor substrate 100 including the GaN layer is formed by MOCVD, the first GaN layer 102 can be easily separated from the sapphire substrate 101 using the cavity 102a, so that the separated GaN layer can be used as the GaN substrate. Accordingly, the GaN substrate may be manufactured at lower costs than the conventional GaN substrate.

Detailed examples of the manufacturing method of the semiconductor substrate 100 will be described hereinafter. In a first example of the first exemplary embodiment, the process of forming the second GaN layer 104 using an MOCVD apparatus will be described. In this example, crystal growth was performed at a heating temperature of 1045° C. for 5 hours while supplying tri-methyl gallium (TMG) as a raw gas at a flux of 20 μmol/min. Further, in the first example, a Ta layer 103 having a thickness of 50 nm was formed in a shape of stripes on the first GaN layer 102.

In FIG. 2, the semiconductor substrate 100 with the second GaN layer 104 formed thereon under these conditions is shown. FIG. 2 is a SEM micrograph of a side section of a portion of the semiconductor substrate 100. As shown in FIG. 2, the cavity 102a is formed at a portion of the first GaN layer 102 under the Ta layer 103. An enlarged region including the cavity 102a in FIG. 2 was analyzed using an energy dispersion x-ray spectrometer (EDX), and the analysis result is shown in FIG. 3.

Figure 4A:
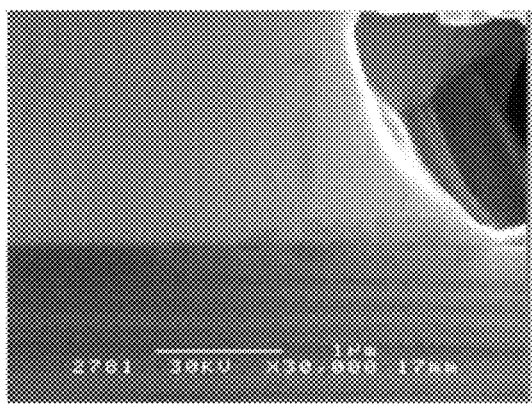
Figure 4B:
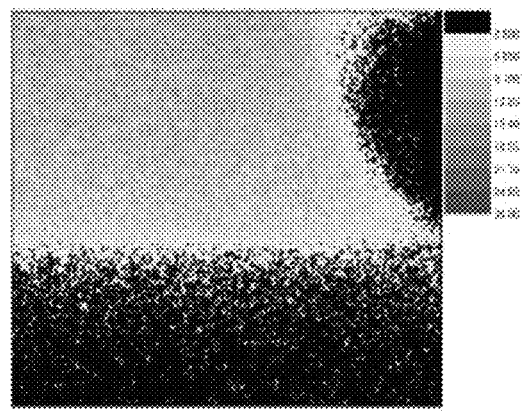
Figure 4C:
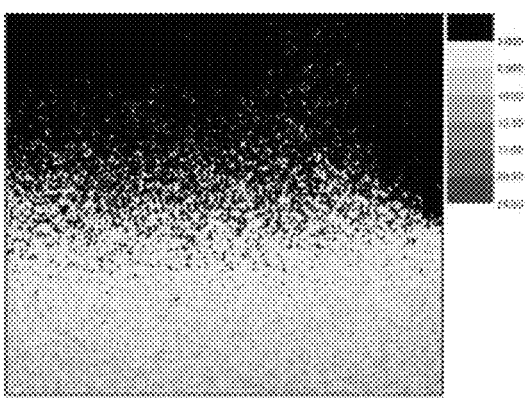
Figure 4D:
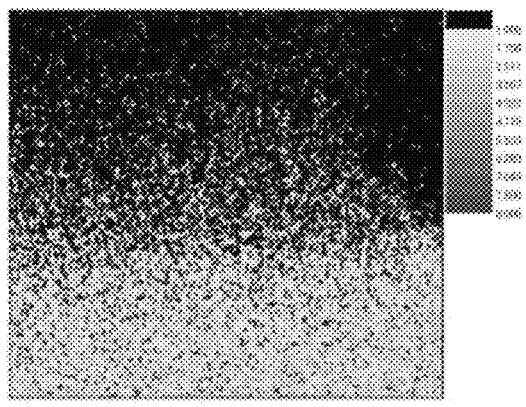

In the EDX spectrum of FIG. 3, GaN of the first GaN layer 102, and Al and O of the sapphire substrate 101 are observed, but Ta is substantially not observed. Further, in EDX diagrams of FIG. 4B, FIG. 4C, and FIG. 4D, Ga of the first GaN layer 102, and Al and O of the sapphire substrate 101 are observed, but Ta is not substantially observed.

In the first example, it was observed that a hole 103a was formed in the Ta layer 103 during the formation of the second GaN layer 104. Analysis results of the hole 103a formed in the Ta layer 103 are shown in FIG. 5 and FIG. 6, and will be described in detail hereinafter. Here, the analysis results shown in FIG. 5 and FIG. 6 were obtained using the EDX by stopping the process of forming the second GaN layer 104 using the MOCVD apparatus.

Figure 5A:
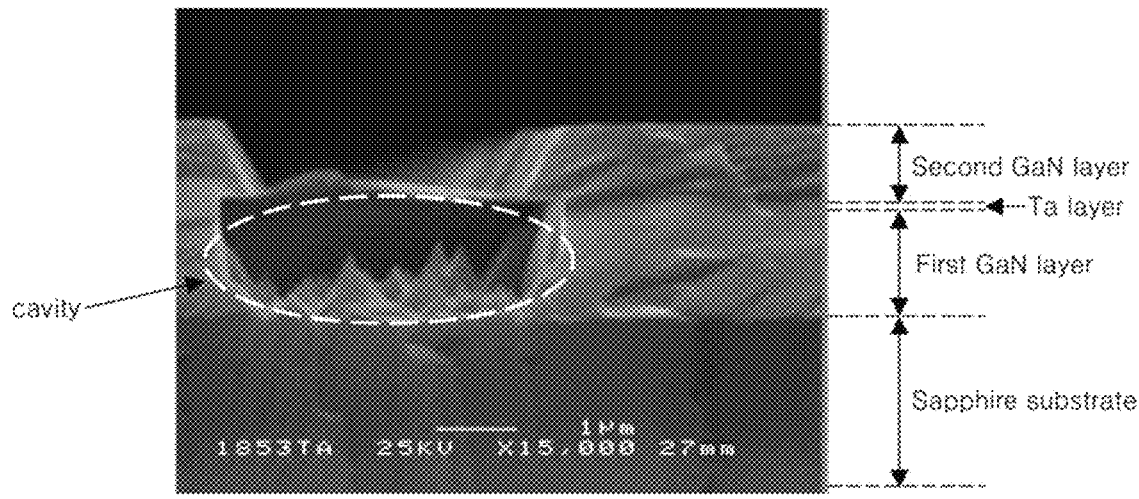
Figure 5B:
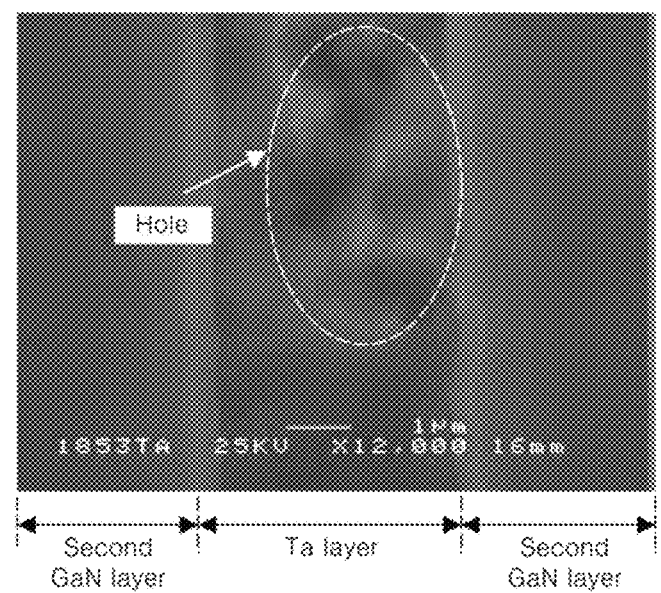
Figure 6A:
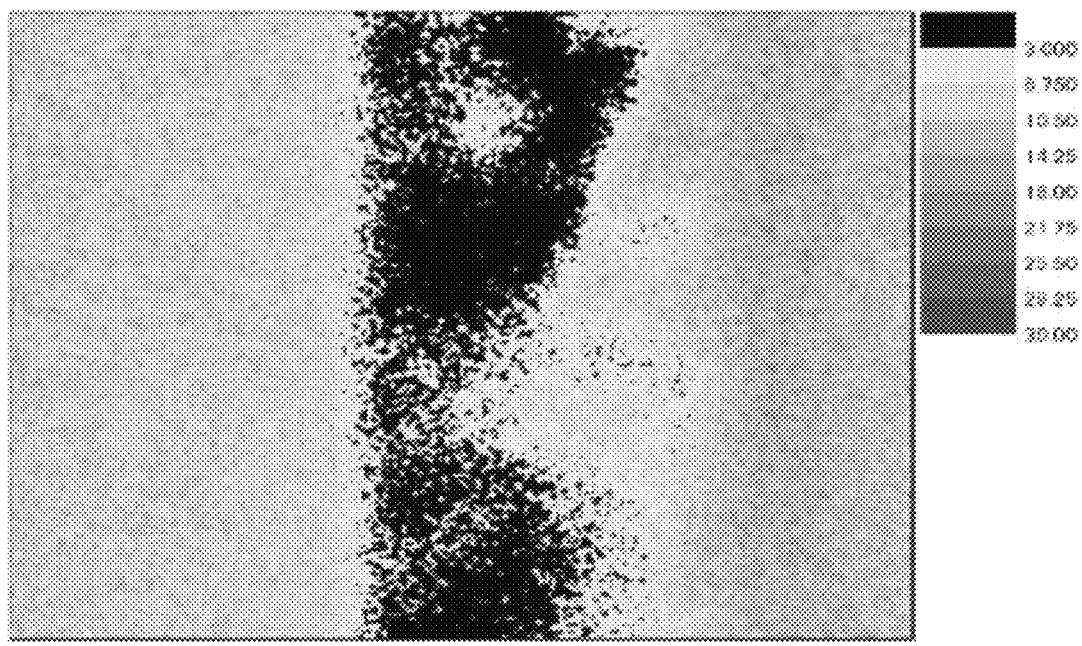
Figure 6B:
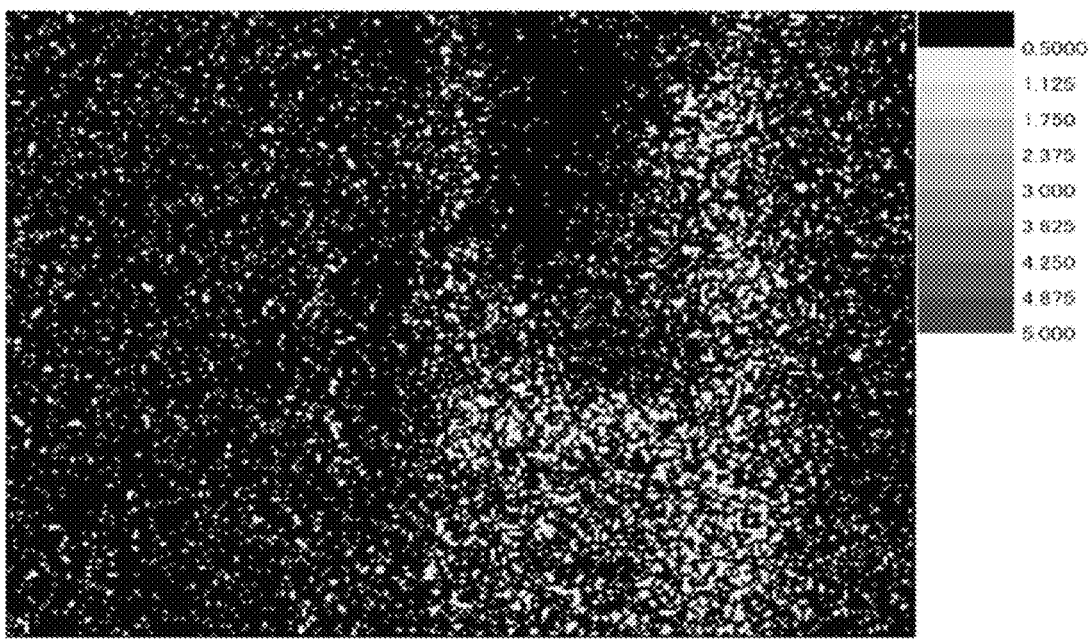

FIGS. 5A and 5B show SEM micrographs of the semiconductor substrate of the first example, in which FIG. 5A is a SEM micrograph of a side section of the semiconductor substrate 100 and FIG. 5B is a SEM micrograph of a surface of the semiconductor substrate 100. FIG. 6 shows EDX diagrams of the surface of the semiconductor substrate 100 of FIG. 5B, in which FIG. 6A is an EDX diagram of Ga and FIG. 6B is an EDX diagram of Ta.

In the SEM micrograph of the semiconductor substrate 100 of FIG. 5A, it is observed that a portion of the first GaN layer 102 under the Ta layer 103 is etched and the cavity 102a is formed therein. In the SEM micrograph of the semiconductor substrate 100 of FIG. 5B, it is observed that holes 103a were formed on a surface of the Ta layer 103. EDX analysis results for Ga and Ta on the surface of the Ta layer 103 including the holes 103a are shown in FIG. 6A and FIG. 6B. As shown in the EDX diagrams, the Ta layer 103 remains, and Ga and GaN are thinly grown on the remaining Ta layer 103.

As such, for the semiconductor substrate 100 of the first example, the conditions for forming the second GaN layer 104 using the MOCVD apparatus were adjusted, thereby enabling the cavity 102a to be formed in the first GaN layer 102 using the Ta layer by etching. Thus, when the second GaN layer 104 was formed as illustrated in the first exemplary embodiment, it was possible to form the cavity 102a in the first GaN layer 102 by etching during growth of the first GaN layer 102. In other words, when a metallic material layer was partially formed on the first GaN layer 102, it was possible to form the cavity 102a in the first GaN layer 102. The metallic material layer may be used for etching the first GaN layer 102 as discussed above in relation to the first exemplary embodiment.

In addition, the MOCVD conditions for the first example are provided as an example, and thus, may be set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the first example.

Further, in the first example, the holes 103a were formed in the Ta layer 103 during the process of growing the second GaN layer 104, but, for example, the Ta layer 103 may be formed using a mask which is previously formed with a hole. Further, the shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the first example may be reused as a substrate 101 forming a GaN layer having the aforementioned cavity by separating the GaN substrate and then a surface of the sapphire substrate 101 on which a new GaN substrate is formed may be flattened by reactive ion etching (ME) or the like. Hence, manufacturing costs of the GaN substrate can be further reduced.

In a second example of the first exemplary embodiment, the process of forming the second GaN layer 104 using an MOCVD apparatus will be described. In this example, crystal growth was performed at a heating temperature of 1045° C. for 5 hours while supplying TMG as a raw gas at a flux of 20 μmol/min. Further, in the second example, a Ta layer 103 having a thickness of 30 nm was formed in a shape of stripes on the first GaN layer 102.

In FIG. 12, the semiconductor substrate 100 with the second GaN layer 104 formed thereon under these conditions is shown. FIG. 12 is a SEM micrograph of a side section of a portion of the semiconductor substrate 100. As shown in this figure, a cavity 102a is formed at a portion of the first GaN layer 102 under the Ta layer 103. Further, in the second example, it was observed that a hole 103a was formed in the Ta layer 103 during the formation of the second GaN layer 104.

For the semiconductor substrate 100 of the second example, the conditions for forming the second GaN layer 104 using the MOCVD apparatus were adjusted, thereby enabling the cavity 102a to be formed in the first GaN layer 102 using the Ta layer 103 by etching. Thus, when the second GaN layer 104 is formed as illustrated in the second example, it is possible to form the cavity 102a in the first GaN layer 102 by etching during growth of the first GaN layer 102. In other words, when a metallic material layer was partially formed on the first GaN layer 102 it was possible to form the cavity 102a in the first GaN layer 102. The metallic material layer may be used for the etching the first GaN layer 102 as discussed above in relation to the first exemplary embodiment.

In the sectional view of FIG. 12, the cavities 102a caused by etching are not formed in the first GaN layer 102 under the overall lower surface of each of the Ta layers 103, but under opposite ends of each of the Ta layers 103. FIG. 12 shows that etching is performed in the first GaN layer 102 from the opposite ends of each of the Ta layers 103.

Further, the MOCVD conditions for the second example are provided as an example, and thus, may be set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the second example.

Further, in the second example, the holes 103a were formed in the Ta layer 103 during the process of growing the second GaN layer 104, but, for example, the Ta layer 103 may be formed using a mask which is previously formed with a hole. Further, the shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the second example may be reused as a substrate 101 for forming a GaN layer having the aforementioned cavity. The GaN substrate may be separated and then a surface of the sapphire substrate 101 on which a new GaN substrate is formed may be flattened by RIE or the like. Hence, manufacturing costs of the GaN substrate can be further reduced.

In a third example of the first exemplary embodiment, the process of forming the second GaN layer 104 using an MOCVD apparatus will be described. In this example, crystal growth was performed at a heating temperature of 1045° C. for 5 hours while supplying TMG as a raw gas at a flux of 20 μmol/min. Further, in the third example, a Ta layer 103 having a thickness of 50 nm was formed in a shape of stripes on the first GaN layer 102.

In FIG. 13, the semiconductor substrate 100 with the second GaN layer 104 formed thereon under these conditions is shown. FIG. 13 is an SEM micrograph of a side section of a portion of the semiconductor substrate 100. As shown this figure, a cavity 102a is formed at a portion of the first GaN layer 102 under the Ta layer 103. Further, in the third example, it was observed that holes 103a were formed in the Ta layer 103 during the formation of the second GaN layer 104.

For the semiconductor substrate 100 of the third example, the conditions for forming the second GaN layer 104 using the MOCVD apparatus were adjusted, thereby enabling the cavity 102a to be formed in the first GaN layer 102 under the Ta layer 103 by etching. Thus, when the second GaN layer 104 was formed as illustrated in the first exemplary embodiment, it was possible to form the cavity 102a in the first GaN layer 102 by etching during growth of the first GaN layer 102. In other words, when a metallic material layer was partially formed on the first GaN layer 102 it was possible to form the cavity 102a in the first GaN layer 102. The metallic material layer may be used for etching the first GaN layer 102 as discussed above in relation to the first exemplary embodiment.

In addition, the MOCVD conditions for the third example are provided as an example, and thus, may be set to allow the growth of the first GaN layer 102 and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the third example.

Further, in the third example, the holes 103a were formed in the Ta layer 103 during the process of growing the second GaN layer 104, but the Ta layer 103 may be formed using a mask which is previously formed with a hole. Further, the shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the third example may be reused as a substrate 101 for forming a GaN layer having the aforementioned cavity. The GaN substrate may be separated and then a surface of the sapphire substrate 101 on which a new GaN substrate is formed may be flattened by RIE or the like. Hence, manufacturing costs of the GaN substrate can be further reduced.

In a fourth example of the first exemplary embodiment, the process of forming the second GaN layer 104 using an MOCVD apparatus will be described. In this example, crystal growth was performed at a heating temperature of 1045° C. for 5 hours while supplying TMG as a raw gas at a flux of 20 μmol/min. Further, in the fourth example, a Ta layer 103 having a thickness of 100 nm was formed in a shape of stripes on the first GaN layer 102.

Figure 14:
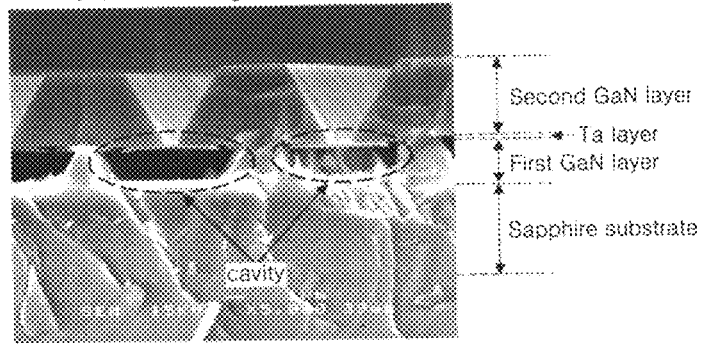
FIG. 14 is a SEM micrograph of a side section of a semiconductor substrate of according to a fourth example of the first exemplary embodiment.

In FIG. 14, the semiconductor substrate 100 with the second GaN layer 104 formed thereon under these conditions is shown. FIG. 14 is a SEM micrograph of a side section of a portion of the semiconductor substrate 100. As shown this figure, a cavity 102a is formed at a portion of the first GaN layer 102 under the Ta layer 103. Further, in the fourth example, it was observed that holes 103a were formed in the Ta layer 103 during the formation of the second GaN layer 104.

For the semiconductor substrate 100 of the fourth example, the conditions for forming the second GaN layer 104 using the MOCVD apparatus were adjusted, thereby enabling the cavity 102a to be formed in the first GaN layer 102 using the Ta layer 103 by etching. Thus, when the second GaN layer 104 was formed as illustrated in the first exemplary embodiment, it was possible to form the cavity 102a in the first GaN layer 102 by etching during growth of the first GaN layer 102. In other words, when a metallic material layer was partially formed on the first GaN layer 102 it was possible to form the cavity 102a in the first GaN layer 102. The metallic material layer may be used for etching the first GaN layer 102 as discussed above in relation to the first exemplary embodiment.

In addition, the MOCVD conditions for the fourth example are provided as an example, and thus, may be set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the fourth example.

Further, in the fourth example, the holes 103a were formed in the Ta layer 103 during the process of growing the second GaN layer 104, but, for example, the Ta layer 103 may be formed using a mask which is previously formed with a hole. Further, the shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the fourth example may be reused as a substrate 101 for forming a GaN layer having the aforementioned cavity. The GaN substrate may be separated and a surface of the sapphire substrate 101 on which a new GaN substrate is formed may be flattened by ME or the like. Hence, manufacturing costs of the GaN substrate can be further reduced.

A first comparative example will be described hereinafter. In the first comparative example, the process of forming the second GaN layer 104 of the semiconductor substrate 100 with a different condition of the MOCVD apparatus will be described.

In the first comparative example, crystal growth was performed at a heating temperature of 1045° C. for 5 hours while supplying TMG as a raw gas at a flux of 87 μmol/min.

Figure 7A:
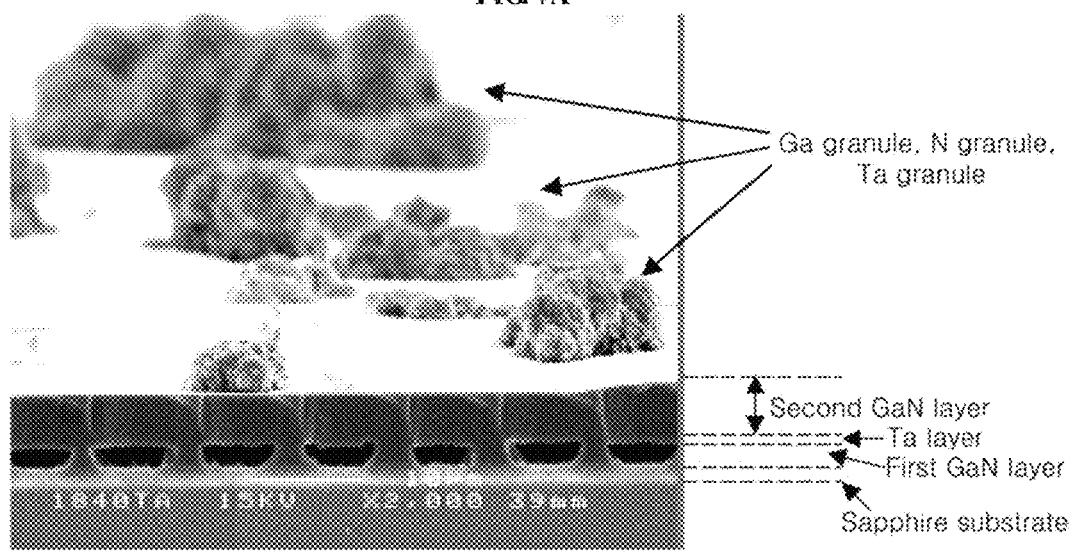
Figure 7B:
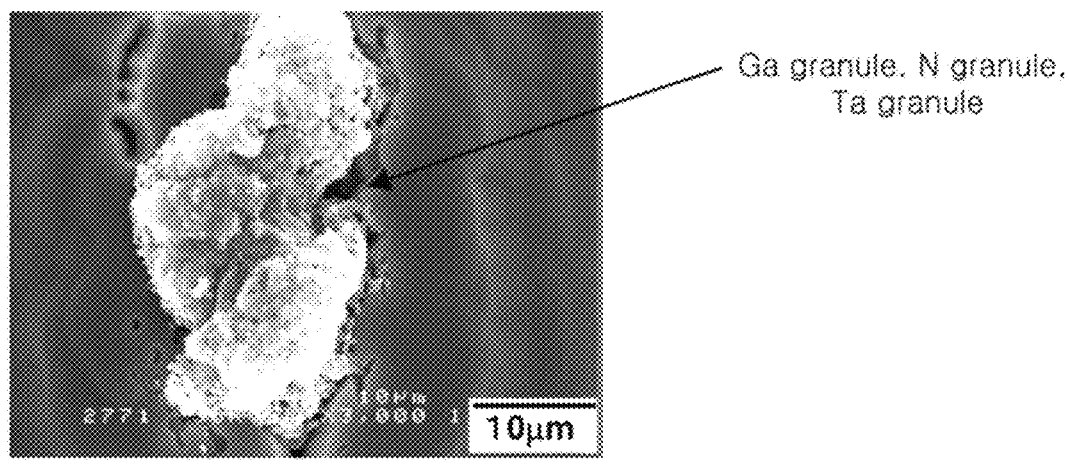

In FIGS. 7A and 7B, the semiconductor substrate 100 with the second GaN layer 104 formed thereon under these conditions is shown. FIG. 7A is a SEM micrograph of a side section of a portion of the semiconductor substrate 100 and FIG. 7B is a SEM micrograph of a surface of the semiconductor substrate shown in FIG. 7A. As shown in these micrographs, granular materials are precipitated on the surface of the second GaN layer 104 and a cavity 102a is formed at a portion of the first GaN layer 102 under the Ta layer 103. The following EDX analysis shows that the granular materials are Ga granules, N granules, and Ta granules.

Figure 8A:
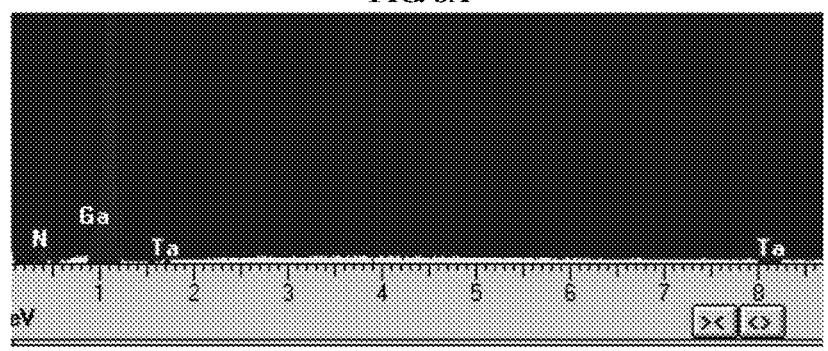
Figure 8B:
Figure 8C:
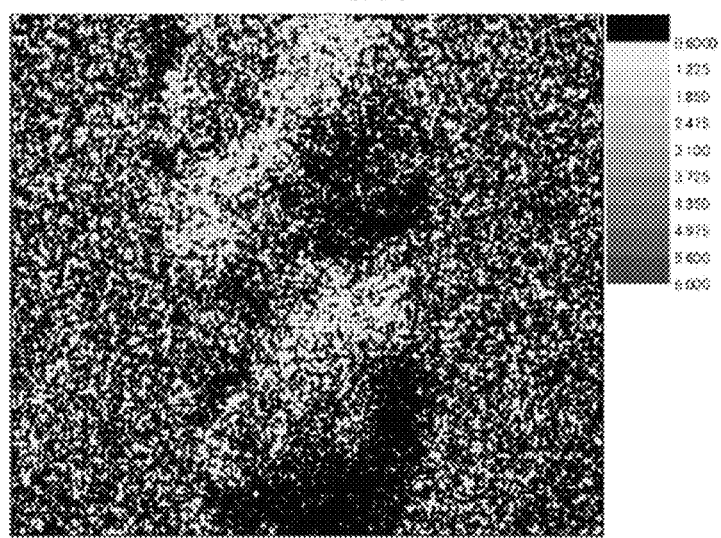

FIGS. 8A-8C show results of EDX analysis on the surface of the granular materials, in which FIG. 8A is an EDX spectrum of the granular materials shown in FIG. 7B, FIG. 8B is an EDX diagram of Ga obtained by EDX analysis of the granular materials of FIG. 7B, and FIG. 8C is an EDX diagram of N obtained by EDX analysis of the granular materials of FIG. 7B. In the EDX spectrum of FIG. 8A, Ga, N and a trace of Ta are observed, so that Ga and N are observed as shown in the EDX diagrams of FIG. 8B and FIG. 8C.

Figure 9A:
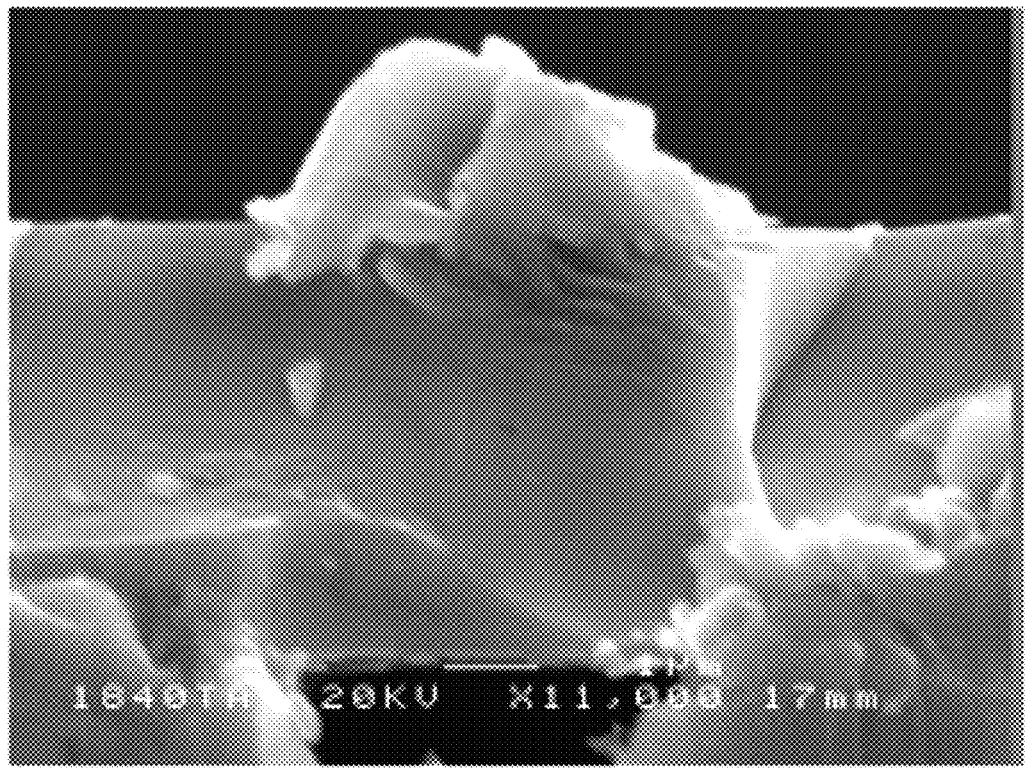
Figure 9B:
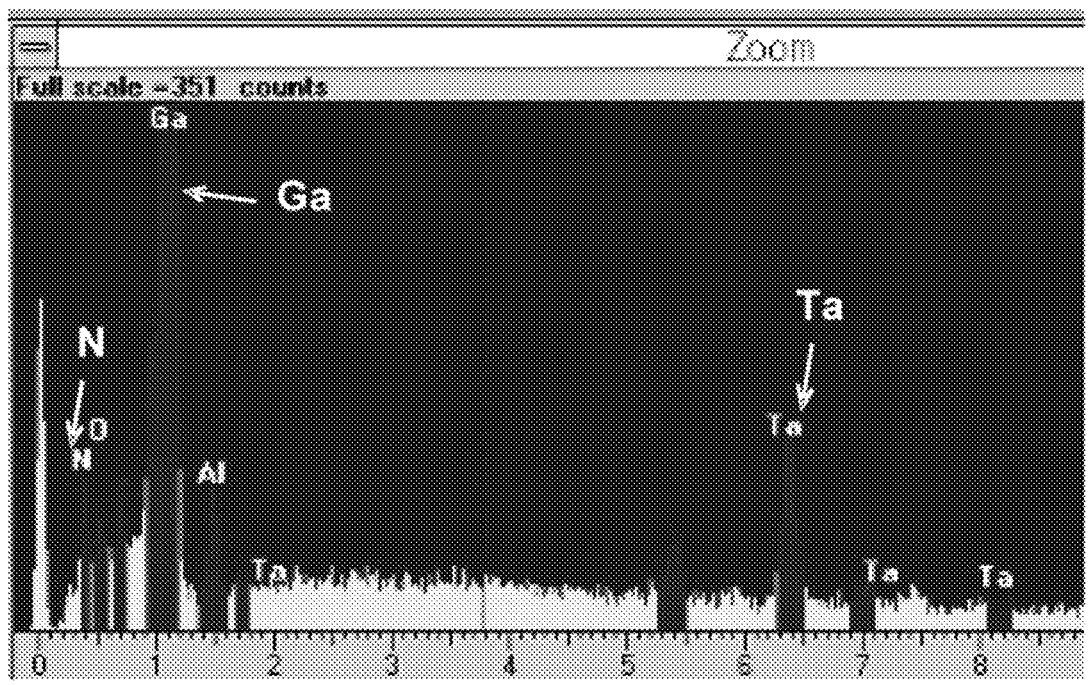
Figure 10A:
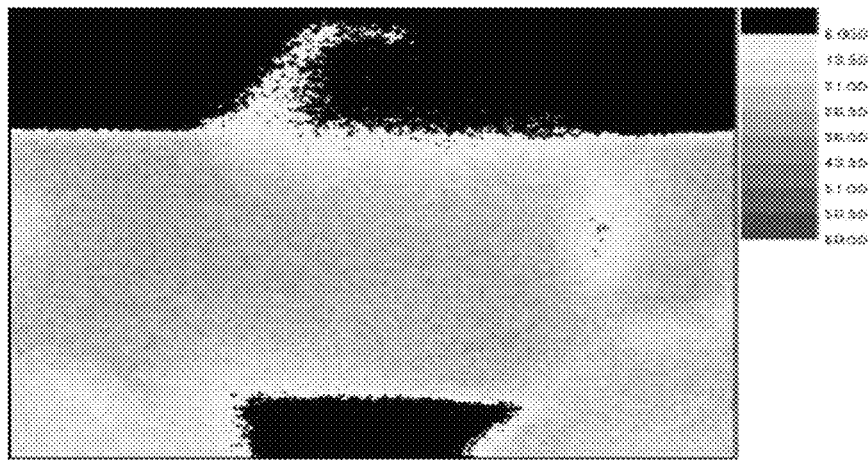
Figure 10B:
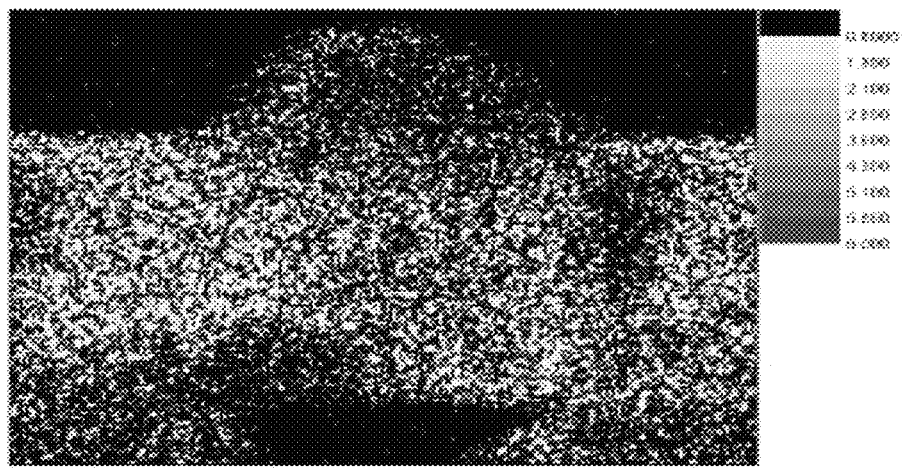
Figure 10C:

Results of EDX analysis on cross sections of the granular materials are shown in FIGS. 9 and 10. FIG. 9A is a SEM micrograph of a side section of a void formed as a granular material shown in FIG. 7B and B is an EDX spectrum of the void shown in FIG. 9A. FIG. 10A is an EDX diagram of Ga obtained by EDX analysis on the side section of the void of FIG. 9A, FIG. 10B is an EDX diagram of N obtained by EDX analysis on the side section of the void of FIG. 9A, and FIG. 10C is an EDX diagram of Ta obtained by EDX analysis on the side section of the void of FIG. 9A.

In the spectrum of FIG. 9B, Ga and N of the second GaN layer 104 and the granular materials, Ta of the Ta layer 103, and Al and O of the sapphire substrate 101 are observed. Further, as shown in FIG. 10A to FIG. 10C, Ga, N and Ta are observed at the void.

The granular materials precipitated on the surface of the second GaN layer 104 are Ga granules, N granules, and Ta granules.

Formation of $Ta_2O_5$ region in Ta layer

In the first, second, third, and fourth examples, the thickness of the Ta layer 103 was changed to 30 nm, 50 nm, and 100 nm. It could be ascertained that the cavity 102a was formed in the first GaN layer 104 by etching even when the thickness of the Ta layer 103 was changed in this manner.

Figure 15A:
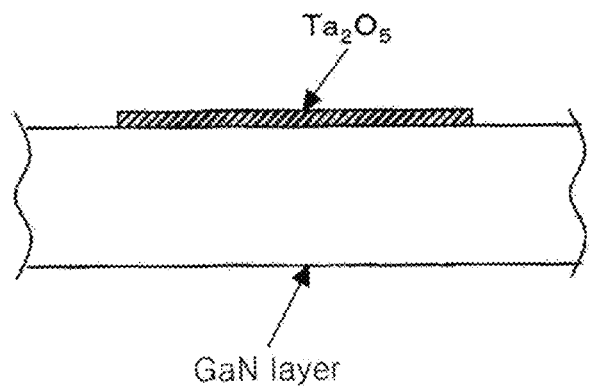
FIG. 15A is a diagram showing an exemplary embodiment of a $Ta_2O_5$ film converted from a 5 nm thick Ta layer.
Figure 15B:
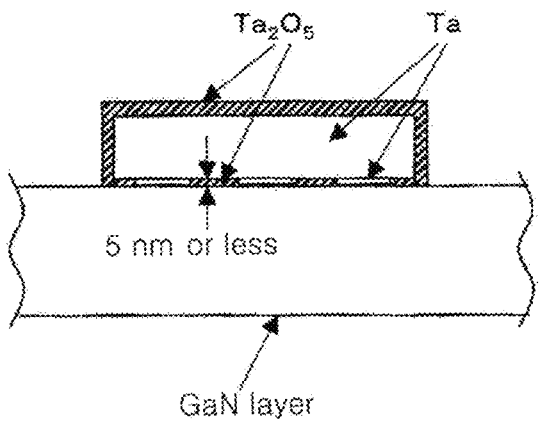
FIG. 15B is a diagram showing an exemplary embodiment of a $Ta_2O_5$ film formed on a surface of a 100 nm thick Ta layer.
Figure 16A:
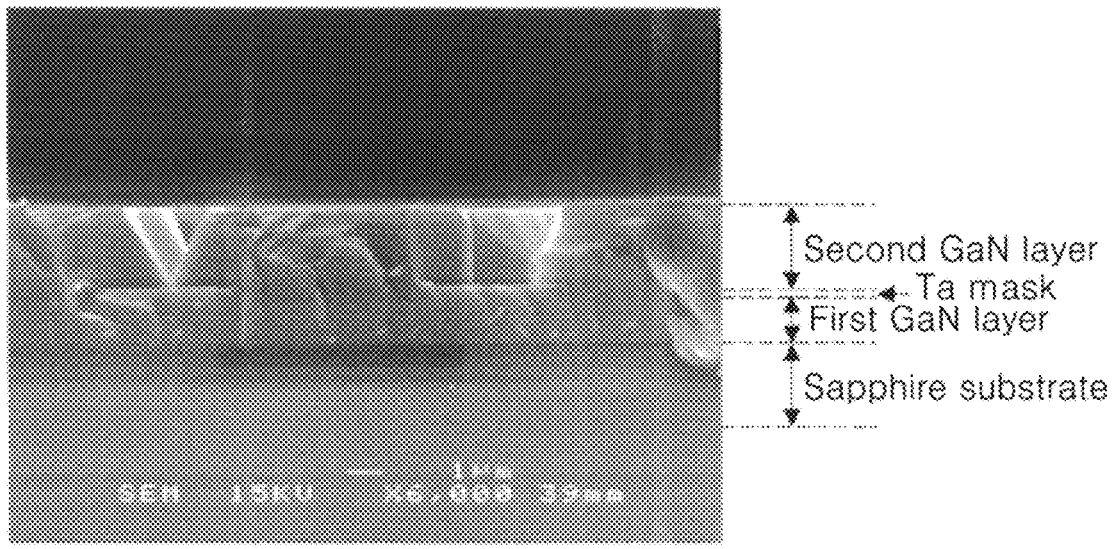
FIG. 16A is a SEM micrograph of a surface of a substrate having a 5 nm thick Ta mask.
Figure 16B:
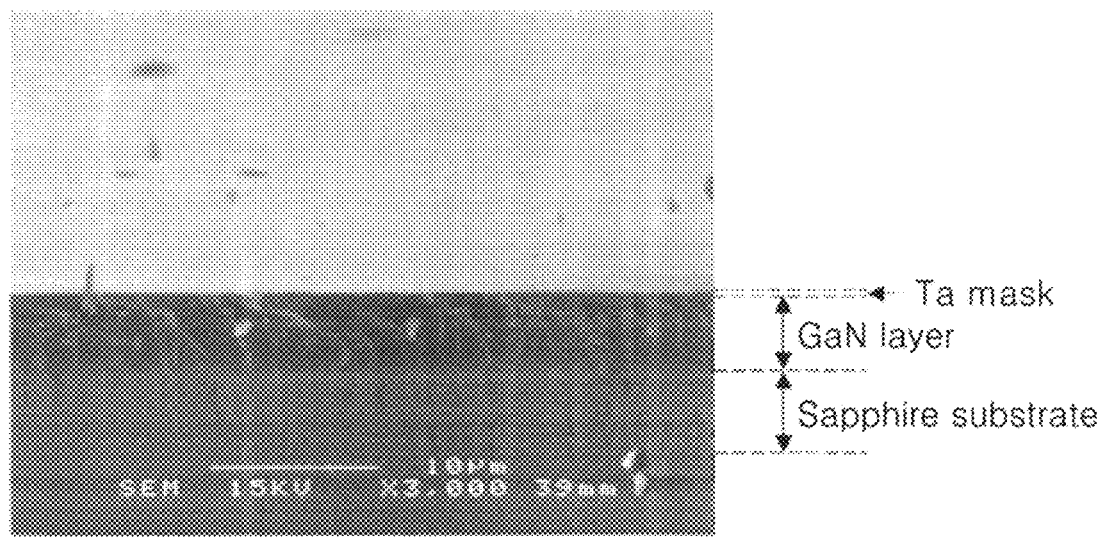
FIG. 16B is a SEM micrograph of a surface of a substrate having a 10 nm thick $Ta_2O_5$ mask.

FIGS. 15A and 15B diagrammatically show that a $Ta_2O_5$ region formed in the Ta layer 103 varies depending on the thickness of the Ta layer 103. FIG. 15A is a diagram showing a $Ta_2O_5$ film converted from a 5 nm thick Ta layer 103 and FIG. 15B is a diagram showing a $Ta_2O_5$ film converted from a surface of a 100 nm thick Ta layer. After depositing the Ta layer 103 on the surface of the first GaN layer 102 using an electron beam (EB) deposition apparatus, the Ta layer 103 was transferred to an MOCVD apparatus while being exposed to air. During the transfer of the Ta layer 103, the Ta layer 103 was converted into $Ta_2O_5$ by reaction with oxygen. As a result, when the Ta layer 103 was deposited to a thickness of 5 nm as shown in FIG. 15A, the overall Ta layer 103 was converted into $Ta_2O_5$, and when the 100 nm thick Ta layer 103 was deposited as shown in FIG. 15B, the surface of the Ta layer 103 was converted into $Ta_2O_5$. In other words, when Ta contacts air at room temperature, $Ta_2O_5$ is formed. FIG. 15A diagrammatically shows an example of lateral growth of a 5 nm thick Ta layer on a GaN layer. Further, FIGS. 16A and 16B show examples of lateral growth of a 10 nm thick $Ta_2O_5$ film on a substrate. In both examples, the growth was progressed without etching of the GaN layer under the Ta layer. In other words, when a substrate having a 5 nm thick Ta layer formed thereon is transferred to the MOCVD apparatus while being exposed to air, a 5 nm thick $Ta_2O_5$ film was formed on the substrate in FIG. 15A. The $Ta_2O_5$ film is a very good mask which grows laterally. On the other hand, when the 100 nm thick Ta layer was deposited as shown in FIG. 15B, the result was different. When the Ta layer is deposited by EB deposition, a raw material of Ta is positioned in air and a thin oxide film is thus formed on the Ta layer. As Ta is further deposited, it is converted initially into $Ta_2O_5$, but is gradually settled down to allow deposition of Ta. The $Ta_2O_5$ film has a thickness of 5 nm or less on the GaN layer and contains a portion composed of Ta. An upper layer of the $Ta_2O_5$ film is composed of Ta. Further, as the substrate having the Ta layer formed thereon is transferred to the MOCVD apparatus while being exposed to air, a thin $Ta_2O_5$ film is formed on the Ta layer. As a result, the surface of the Ta layer is enveloped in the thin $Ta_2O_5$ film. In this Ta layer, the $Ta_2O_5$ film on the GaN layer is partially mixed with Ta. This result is diagrammatically shown in FIG. 15B. Although N of the GaN layer and Ta of the Ta layer are coupled to form TaN, Ga is still used as the raw material, since Ga is the same as Ga deposited during vapor deposition.

In the first, second, third, and fourth examples, a $Ta_2O_5$ region formed by oxidation of the Ta layer 103 is laterally grown with respect to the first GaN layer 102 and serves as a very good etching mask. As a result, in the second example, as shown in FIG. 12, it was ascertained that the $Ta_2O_5$ region was not formed at the opposite ends of the 30 nm thick Ta layer 103, and the formation of the cavity 102a was progressed from portions of the first GaN layer 102 under the opposite ends of the Ta layer 103. In both the third and fourth examples, in which the Ta layers 103 were formed to a thickness of 50 nm and a thickness of 100 nm, respectively, the formation of the cavity 102a was progressed as in the second example, since the $Ta_2O_5$ region was formed on the surface of the Ta layer to act as the etching mask with respect to the first GaN layer 102.

Accordingly, as in the first, second, third, and fourth examples, a thickness of the Ta layer 103 may be in the range of 20~100 nm in order to permit formation of the $Ta_2O_5$ region, which acts as the etching mask. Further, in FIG. 16A, which shows an example of a 5 nm thick Ta mask formed on the first GaN layer 102, the cavity 102a is not formed under the Ta mask. Further, in FIG. 16B, which shows an example of forming only the $Ta_2O_5$ mask, it is ascertained that the $Ta_2O_5$ mask can be formed on the GaN layer and InGaAlN layer, for example. Thus, since the $Ta_2O_5$ mask is formed regardless of the thickness of the Ta layer 103, it is possible to progress the formation of the cavity 102a in the first GaN layer 102 under the $Ta_2O_5$ mask.

In the first exemplary embodiment, the Ta layer 103 is formed in the shape of stripes on the first GaN layer 102, and the cavity 102a is formed at a portion of the first GaN layer 102 under the Ta layer 103 by using the Ta layer 103 as an etching mask. In the second exemplary embodiment, °and Cr are used as materials for the etching mask.

Figure 17A:
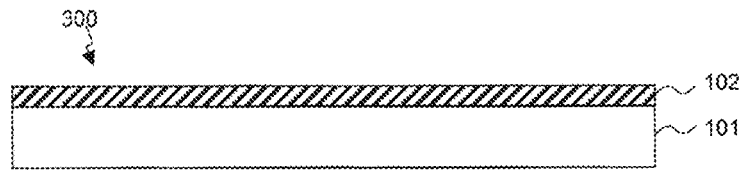
Figure 17B:
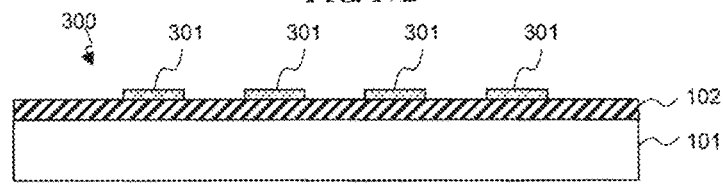
Figure 17C:
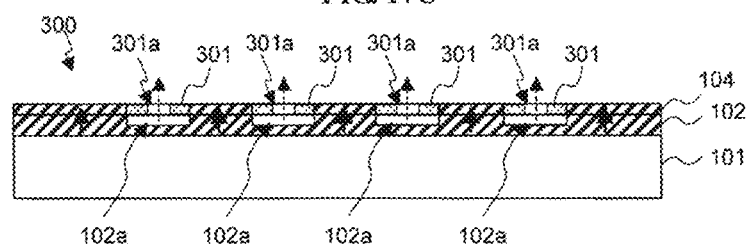
Figure 17D:
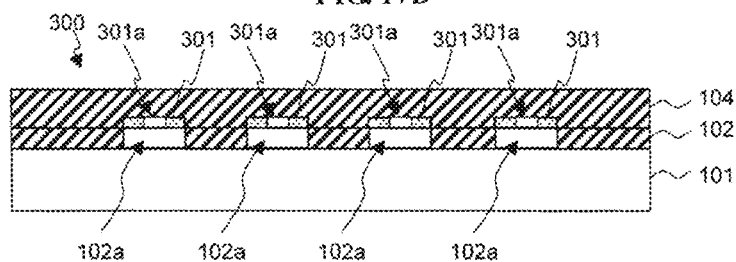
Figure 17E:
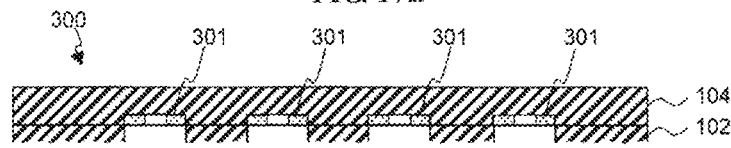
Figure 17F:
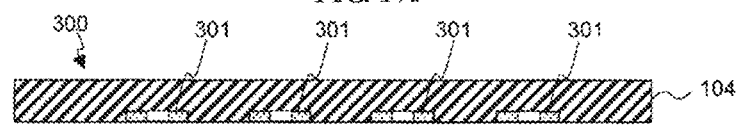

FIG. 17A-17F are flow diagrams of a method of manufacturing a semiconductor substrate 300 in accordance with the second exemplary embodiment. FIG. 17 A is a sectional view of a process of forming a first GaN layer, FIG. 17B is a sectional view of a process of forming a Ti (or Cr) layer, FIG. 17C is a sectional view of a process of forming a second GaN layer and a cavity, FIG. 17D is a sectional view of the semiconductor substrate after forming the second GaN layer, FIG. 17E is a sectional view of the semiconductor substrate from which a sapphire substrate is separated, and FIG. 17F is a sectional view of a finished GaN substrate. In the description of the second exemplary embodiment of FIGS. 17A-17F, the same components of the semiconductor substrate 100 as those of the first exemplary embodiment will be denoted by the same reference numerals as those shown in FIGS. 1A-1F.

Referring to FIG. 17A, reference numeral 101 indicates a sapphire ($Al_2O_3$) substrate. First, a first GaN layer 102 having a thickness of about 2 μm is formed on the sapphire substrate 101. This thickness of the first GaN layer 102 is provided as an example.

Next, referring to FIG. 17B, a Ti layer (metallic material layer) 301 having a thickness of about 50 nm is formed in a shape of stripes, which have a width of 5 μm and are separated at a distance of 5 μm from each other, on the first GaN layer 102 by electron beam (EB) deposition and lift-off. The shape, thickness, width, and distance of the Ti layer 301 are provided as one example.

Next, referring to FIG. 17C, a second GaN layer 104 is formed on the first GaN layer 102 and the Ti layer 301 by metal organic chemical vapor deposition (MOCVD). The first GaN layer 102 and the second GaN layer 104 may include different semiconductor material such as AlGaN, InGaN, or AlInGaN. FIG. 17C shows the second GaN layer 104 during formation thereof. In the present exemplary embodiment, N in the first GaN layer 102 combines with Ti to form TiN, which acts as foreign matter and rises towards a vapor having a higher density of N. The TiN becomes unstable at 900° C. or more, and holes 301a are deepened to form cavities 102a depending on the degree of instability. Here, although N in the first GaN layer 102 becomes TiN, Ga remains in the first GaN layer 102. Since this Ga remaining in the first GaN layer 102 is the same as Ga deposited during the vapor deposition, it is used as the raw material.

Next, referring to FIG. 17D, once the formation of the second GaN layer 104 is completed, the semiconductor substrate 300 is formed. While the second GaN layer 104 is formed by MOCVD, a portion of the first GaN layer 102 under the Ti layer 301 is removed by etching and a formation region of the cavity 102a is extended substantially to the sapphire substrate 101. Further, since the growth of the first GaN layer 102 is progressed together with the growth of the second GaN layer 104, the surface of the substrate is flattened as shown in FIG. 17. Thus, it is possible to omit the process of flattening the substrate surface in the semiconductor substrate 300 of this embodiment.

Next, FIGS. 17E and 17F show a process of separating the sapphire substrate 101 and a process of polishing the first GaN layer 102 separated from the sapphire substrate 101, which are the same as those described with reference to FIGS. 1E and 1F. A detailed description thereof will be omitted herein.

As such, when the semiconductor substrate 300 including the GaN layer is formed by MOCVD, the first GaN layer 102 can be easily separated from the sapphire substrate 101 using the cavity 102a, so that the separated GaN layer can be used as the GaN substrate 300. Therefore, the GaN substrate 300 may be manufactured at lower costs than the conventional GaN substrate. A detailed example of the manufacturing method of the semiconductor substrate 300 shown in FIG. 17 will be described hereinafter in a first example of the second exemplary embodiment (the fifth example), in which Cr is used as a material for the etching mask.

A detailed example of the manufacturing method of the semiconductor substrate 300 having the Ti layer 301 formed thereon will be described hereinafter. In the fifth example, the process of forming the second GaN layer 104 using an MOCVD apparatus will be described. In this example, crystal growth was performed at a heating temperature of 1045° C. for 50 minutes while supplying TMG as a raw gas at a flux of 80 μmol/min. Further, in the fifth example, a Ti layer 301 having a thickness of 50 nm was formed in a shape of stripes on the first GaN layer 102.

Figure 18A:
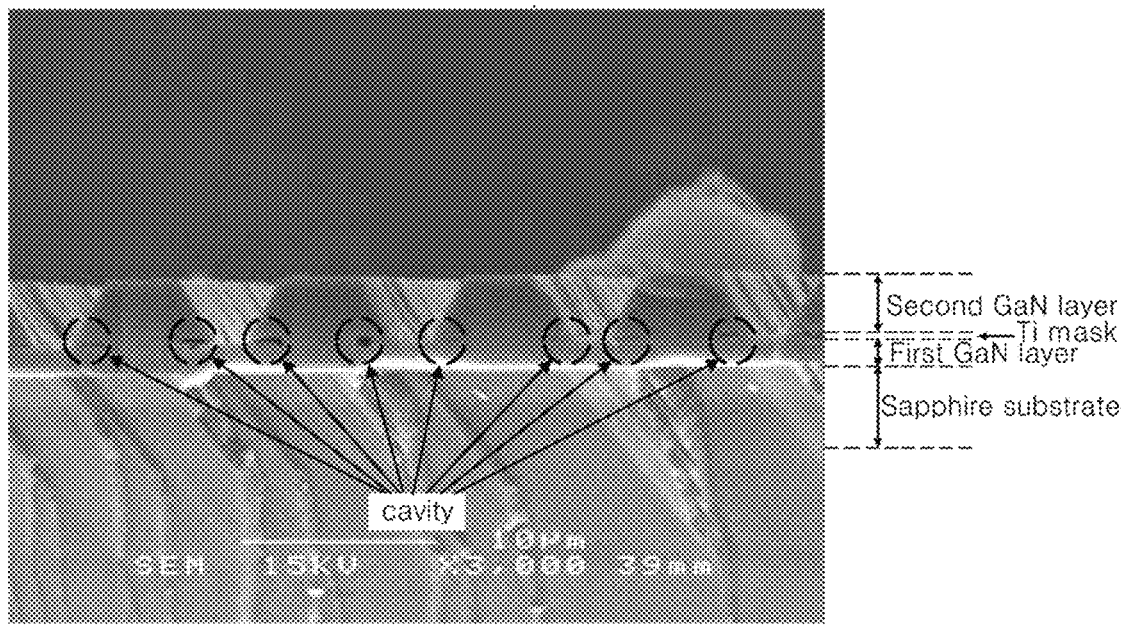
FIG. 18A is a SEM micrograph of a side section of a semiconductor substrate according to a first example of the second exemplary embodiment.

In FIG. 18A, the semiconductor substrate 300 with the second GaN layer 104 formed thereon under these conditions is shown. FIG. 18A is a SEM micrograph of a side section of a portion of the semiconductor substrate 300. As shown in FIG. 18A, the cavity 102a is formed at a portion of the first GaN layer 102 under the Ti layer 301. Further, in the fifth example, it was observed that holes 301a were formed in the Ti layer 301 during the formation of the second GaN layer 104 (see FIG. 17C and FIG. 17D).

As such, for the semiconductor substrate 300 of the fifth example, the conditions for forming the second GaN layer 104 using the MOCVD apparatus were adjusted, thereby enabling the cavity 102a to be formed in the first GaN layer 102 using the Ti layer 301 by etching. Thus, when the second GaN layer 104 was formed as illustrated in the second exemplary embodiment, it was possible to form the cavity 102a in the first GaN layer 102 by etching during growth of the first GaN layer 102. In other words, when the Ti layer 301 as a metallic material layer was partially formed on the first GaN layer 102, it was possible to form the cavity 102a in the first GaN layer 102. The Ti metallic material layer may be used for etching the first GaN layer 102 as discussed above.

In addition, the MOCVD conditions for the fifth example are provided as an example, and thus, may be set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the fifth example.

Further, in second exemplary embodiment, the holes 301a were formed in the Ti layer 301 during the process of growing the second GaN layer 104, but, for example, the Ti layer 301 may be formed using a mask which is previously formed with a hole. Further, the shape of the Ti layer 301 is not limited to the aforementioned stripe shape, and may be changed depending on a device structure to be formed on the semiconductor substrate 300. An example of a device formed using the semiconductor substrate 300 will be described below.

Further, the semiconductor substrate 300 of the second exemplary embodiment may be reused as a substrate 101 forming a GaN layer having the aforementioned cavity by separating the GaN substrate and a surface of the sapphire substrate 101 on which a new GaN substrate is formed may be flattened by RIE or the like. Hence, manufacturing costs of the GaN substrate can be further reduced.

A second comparative example relating to the fifth example will be described hereinafter. In the second comparative example, the process of forming the second GaN layer 104 of the semiconductor substrate 300 under different MOCVD conditions by changing the thickness of the Ti layer 301 will be described.

In the second comparative example, crystal growth was performed at a heating temperature of 1120° C. for 5 hours while supplying TMG as a raw gas at a flux of 20 μmol/min.

Figure 18B:
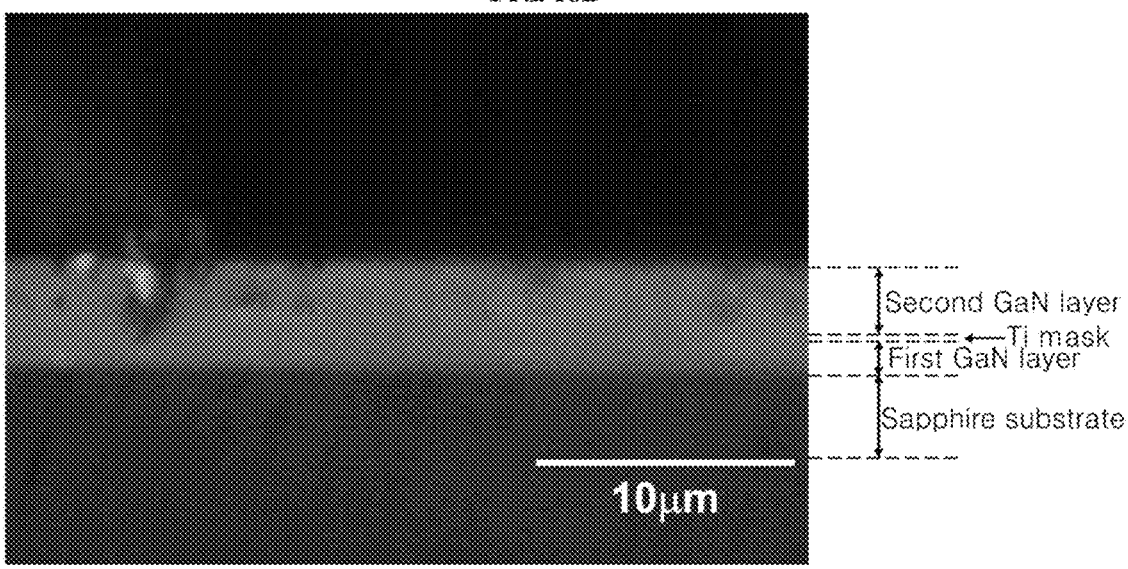
FIG. 18B is a SEM micrograph of a side section of the semiconductor substrate of a first comparative example.

FIG. 18B shows the semiconductor substrate 300 with the second GaN layer 104 formed thereon under these conditions. In FIG. 18B, the Ti layer 301 has a thickness of 10 nm. In this case, the cavity 102a is not formed in the first GaN layer 102 under the Ti layer 301.

Accordingly, it is ascertained that when using Ti as a material for the etching mask, a preferred thickness of the Ti layer 301 permitting the cavity 102a to be formed in the first GaN layer 102 is 50 nm or more, and a preferred flux X of TMG is lower than 80 μmol/min (that is, X<80 μmol/min).

A detailed example of the manufacturing method of the semiconductor substrate 300 having the Cr layer formed thereon will be described hereinafter. In a first condition of a second example of the second exemplary embodiment (a sixth example), the process of forming the second GaN layer 104 using the MOCVD apparatus will be described. In the first condition, crystal growth was performed at a heating temperature of 1060° C. for 40 minutes while supplying TMG as a raw gas at a flux of 80 μmol/min. Further, in the first condition of the sixth example, a 23 nm thick Cr layer was formed in a shape of stripes on the first GaN layer 102.

Figure 19A:
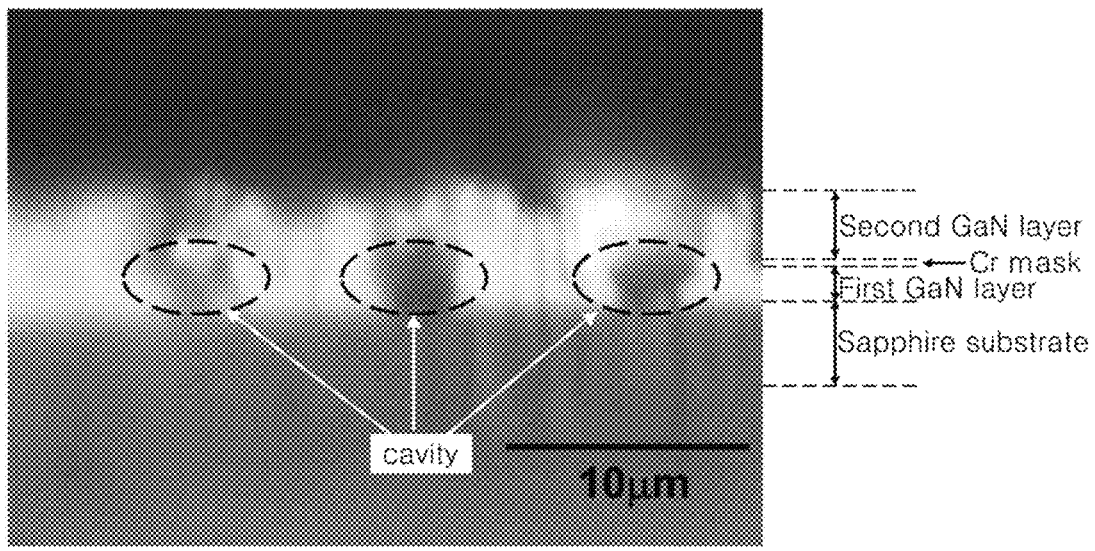
FIG. 19A is a SEM micrograph of a side section of a semiconductor substrate according to a second example of the second exemplary embodiment formed in a first condition and FIG. 19B is a SEM micrograph of a side section of a semiconductor substrate according to a second example of the second exemplary embodiment formed in a second condition.

In FIG. 19A, the semiconductor substrate 300 with the second GaN layer 104 formed thereon under the first condition is shown. FIG. 19A is a SEM micrograph of a side section of a portion of the semiconductor substrate 300. As shown in this figure, the cavity 102a is formed at a portion of the first GaN layer 102 under the Cr layer.

In a second condition of the sixth example, crystal growth was performed at a heating temperature of 1045° C. for 40 minutes while supplying TMG as a raw gas at a flux of 80 μmol/min. Further, in the second condition of the sixth example, a 50 nm thick Cr layer was formed in a shape of stripes on the first GaN layer 102.

Figure 19B:
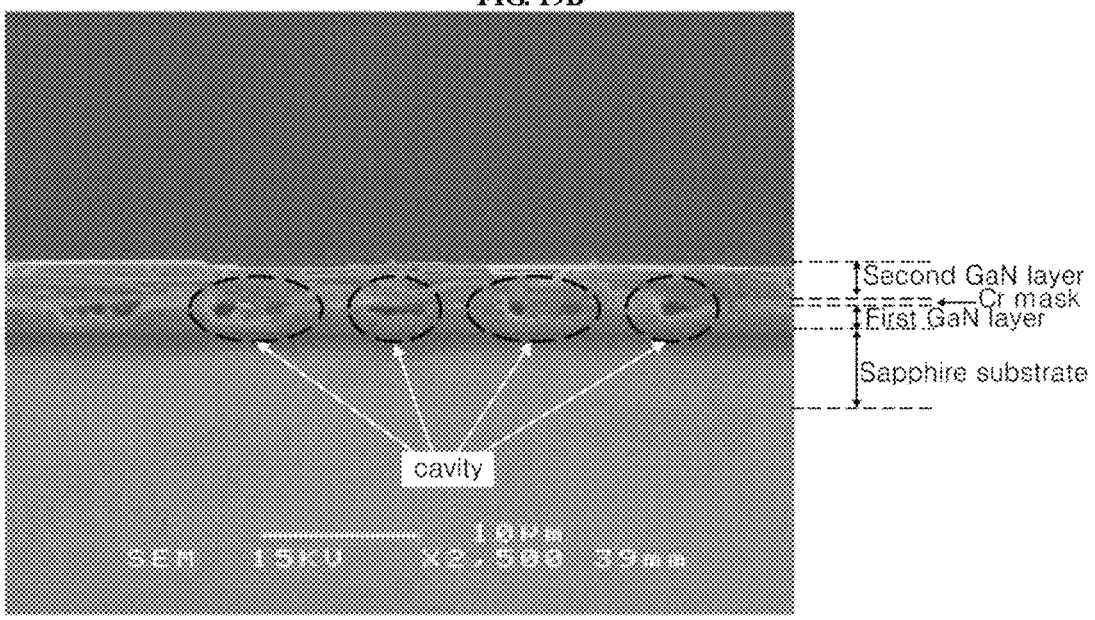

In FIG. 19B, the semiconductor substrate 300 with the second GaN layer 104 formed thereon under the second condition is shown. FIG. 19B is a SEM micrograph of a side section of a portion of the semiconductor substrate 300. As shown in FIG. 19B, the cavity 102a is formed at a portion of the first GaN layer 102 under the Cr layer.

For the semiconductor substrate 300 of the sixth example, the conditions for forming the second GaN layer 104 using the MOCVD apparatus were adjusted, thereby enabling the cavity 102a to be formed in the first GaN layer 102 using the Cr layer by etching. Thus, when the second GaN layer 104 was formed as illustrated in second exemplary embodiment, it was possible to form the cavity 102a in the first GaN layer 102 by etching during growth of the first GaN layer 102. In other words, when the Cr layer as a metallic material layer was partially formed on the first GaN layer 102, it was possible to form the cavity 102a in the first GaN layer 102. The Cr metallic material layer may be used for etching the first GaN layer 102 as discussed above.

Further, the MOCVD conditions for the sixth example are provided as examples, and thus, may be set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the sixth example.

A third comparative example will be described hereinafter. In the third comparative example, the semiconductor substrate is formed by forming a metallic material layer other than the Ti layer and the Cr layer, which are formed in the fifth and sixth examples, respectively.

FIG. 20 is a SEM micrograph of a side section of a semiconductor substrate using a tungsten (W) layer as the metallic material layer. For this semiconductor substrate, a 17 nm thick W layer was formed as the metallic material layer in a stripe pattern on the first GaN layer, and the second GaN layer was formed by crystal growth at a temperature of 1045° C. for 40 minutes while supplying TMG as a raw gas at a flux of 80 μmol/min using the MOCVD apparatus. In this case, the cavity was not formed in the first GaN layer under the W layer.

FIG. 21 is a SEM micrograph of a side section of a semiconductor substrate using a platinum (Pt) layer as the metallic material layer. For this semiconductor substrate, an 8 nm thick Pt layer was formed as the metallic material layer in a stripe pattern on the first GaN layer, and the second GaN layer was formed by crystal growth at a heating temperature of 1120° C. for 40 minutes while supplying TMG at a flux of 80 μmol/min using the MOCVD apparatus. In this case, the cavity was not formed in the first GaN layer under the Pt layer.

FIG. 22 is a SEM micrograph of a side section of a semiconductor substrate using a nickel (Ni) layer as the metallic material layer. For this semiconductor substrate, a 12 nm thick Ni layer was formed as the metallic material layer in a stripe pattern on the first GaN layer, and the second GaN layer was formed by crystal growth at a heating temperature of 1045° C. for 40 minutes while supplying TMG at a flux of 80 μmol/min using the MOCVD apparatus. In this case, the cavity was not formed in the first GaN layer under the Ni layer.

FIG. 23 is a SEM micrograph of a side section of a semiconductor substrate using a molybdenum (Mo) layer as the metallic material layer. For this semiconductor substrate, a 30 nm thick Mo layer was formed as the metallic material layer in a stripe pattern on the first GaN layer, and the second GaN layer was formed by crystal growth at a heating temperature of 1045° C. for 40 minutes while supplying TMG at a flux of 80 μmol/min using the MOCVD apparatus. In this case, the cavity was not formed in the first GaN layer under the Mo layer.

As such, when using the W layer, Pt layer, Ni layer, and Mo layer as the metallic material layer, the cavity was not formed in the first GaN layer 102, and thus, the semiconductor substrate enabling the first GaN layer 102 to be separated from the sapphire substrate using the cavity was not manufactured.

Further, in the semiconductor substrates 100 and 300 of the first and second embodiments, the Ta layer 103, the Ti layer 301, and the Cr layer are formed as the metallic material layer in the stripe pattern on the first GaN layer 102, but a material used for an underlayer of the metallic material layer is not limited to GaN. That is, any material comprising N, which reacts with the metallic material layer, may be used. For example, InGaAlN may be used as the material for the underlayer of the metallic material layer.

In the third exemplary embodiment, when forming the second GaN layer, a portion of the second GaN layer is initially formed on the first GaN layer and the Ta layer, and an additional second GaN layer is formed by ultrasound cleaning the semiconductor substrate to remove the Ta layer.

FIGS. 24A-A-24A-E are flow diagrams of a method of manufacturing a semiconductor substrate 400 in accordance with the third exemplary embodiment. In FIG. 24A-A is a sectional view of a process of forming a first GaN layer, FIG. 24A-B is a sectional view of a process of forming a Ta layer, FIG. 24A-C is a sectional view of a process of forming a second GaN layer and a cavity, FIG. 24A-D is a sectional view of a finished semiconductor substrate, FIG. 24A-E is a sectional view of a process of separating a sapphire substrate, and FIG. 24A-F is a sectional view of a finished GaN substrate.

Referring to FIG. 24A-A, reference numeral 401 indicates a sapphire ($Al_2O_3$) substrate. First, a first GaN layer 402 having a thickness of about 2 μm is formed on the sapphire substrate 401. This thickness of the first GaN layer 402 is provided as an example.

Next, referring to FIG. 24A-B, a Ta layer (metallic material layer) 403 having a thickness of about 5 μm is formed in a shape of stripes, which have a width of 5 μm and are separated a distance of 4 μm from each other, on the first GaN layer 402 by electron beam (EB) deposition and lift-off. The shape, thickness, width, and distance of the Ta layer 403 are provided as one example.

Figure 26A:
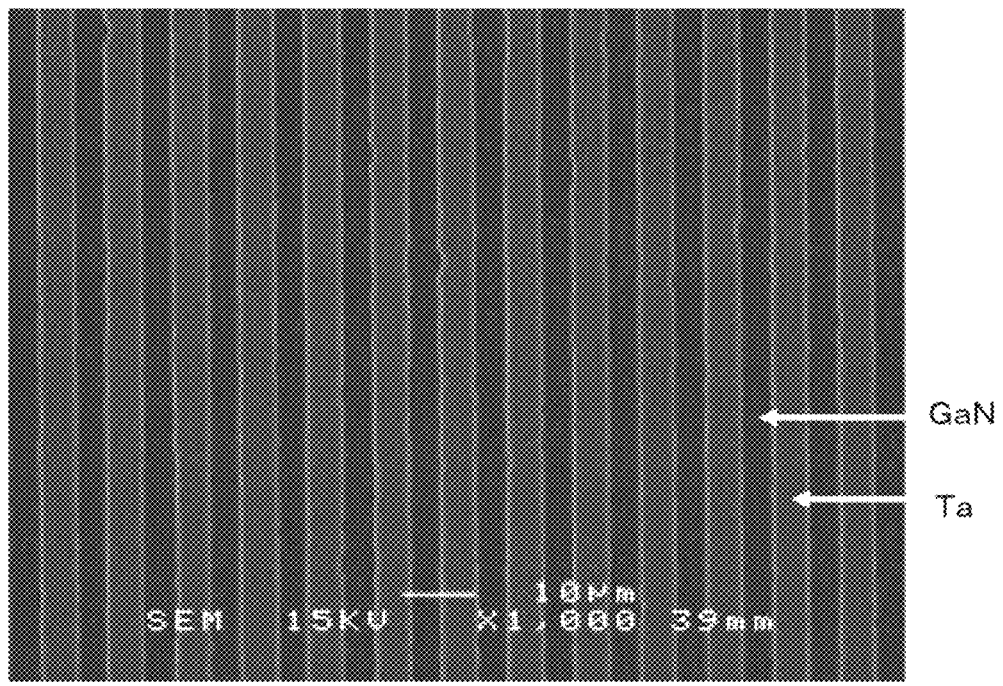
FIG. 26A is a SEM micrograph of a surface of a semiconductor substrate having a portion of a second GaN layer formed by the method in accordance with the third exemplary embodiment.
Figure 26B:
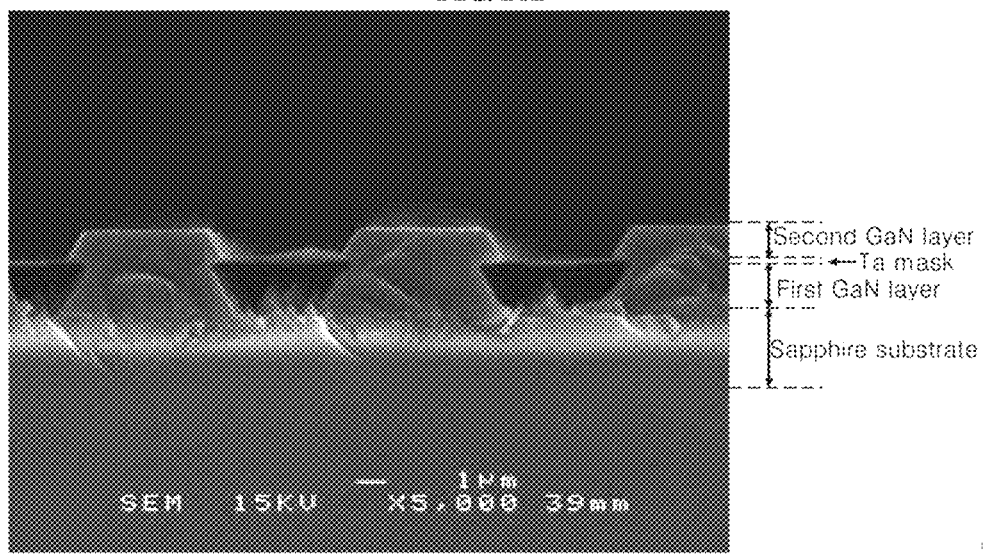
FIG. 26B is a SEM micrograph of a side section of the semiconductor substrate of FIG. 26A.

Referring to FIG. 24A-C, a portion of a second GaN layer 404 is formed on the first GaN layer 402 and the Ta layer 403. The first GaN layer 402 and the second GaN layer 404 may include different semiconductor material, such as AlGaN, InGaN, or AlInGaN. In order to form this second GaN layer 404, a semiconductor substrate 400 having the Ta layer 403 formed on the first GaN layer 402 in FIG. 24A-B is placed in an MOCVD apparatus (not shown), and is held at 1000° C. for 20 minutes at a pressure of 500 Torr in the MOCVD apparatus while supplying $NH_3$ gas at a flux of 0.4 mol/min thereto. FIG. 26A is a SEM micrograph of a surface of the semiconductor substrate 400 having the portion of the second GaN layer 404 formed by this process. FIG. 26B is a SEM micrograph of a side section of this semiconductor substrate. In the present exemplary embodiment, the semiconductor substrate 400 has an irregular surface. In this process, although TMG is not supplied as the raw material while supplying the $NH_3$ gas, the second GaN layer is grown as shown in FIG. 26B. The reason behind this is that, in the MOCVD apparatus, Ga of the first GaN layer 402 reacts with the $NH_3$ gas at 1000° C. or more to form GaN, thereby allowing the growth of the second GaN layer 404. Further, TaN becomes unstable at 900° C. or more, and a hole is deepened to form a cavity 402a depending on the degree of instability. Here, although N in the first GaN layer 402 forms TaN, Ga remains in the first GaN layer 402. Since this Ga remaining in the first GaN layer 402 is the same as Ga deposited during vapor deposition, it is used as the raw material. Further, when forming the portion of the second GaN layer 404, TMG may be used as the raw material instead of the $NH_3$ gas as in the first exemplary embodiment. For example, the portion of the second GaN layer 404 may be formed by crystal growth at a heating temperature of 1045° C. while supplying TMA at a flux of flux of 20 μmol/min in the MOCVD apparatus.

Figure 27A:
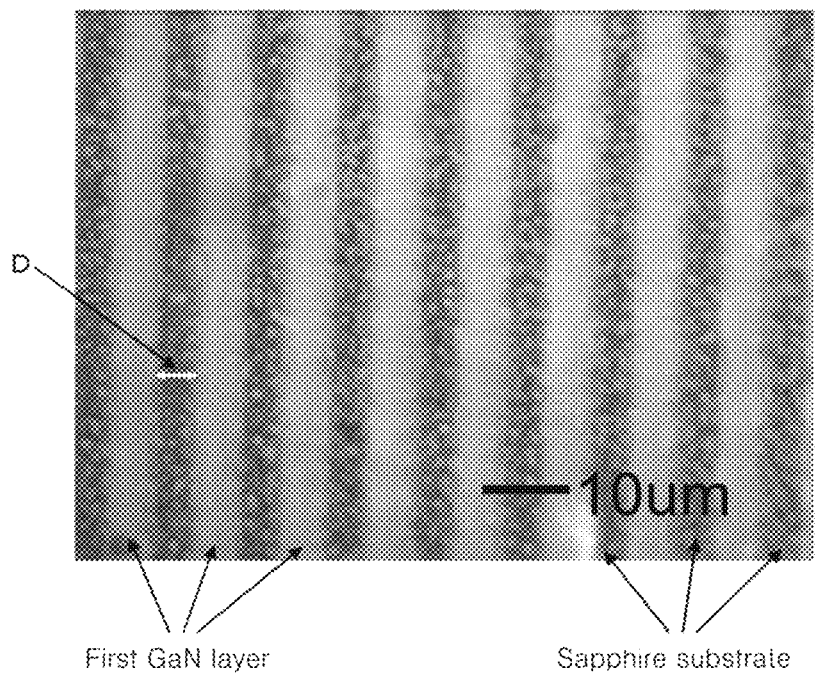
FIG. 27A is an optical micrograph of a surface of a semiconductor substrate formed by the method in accordance with the third exemplary embodiment, from which the Ta layer is removed.
Figure 27B:
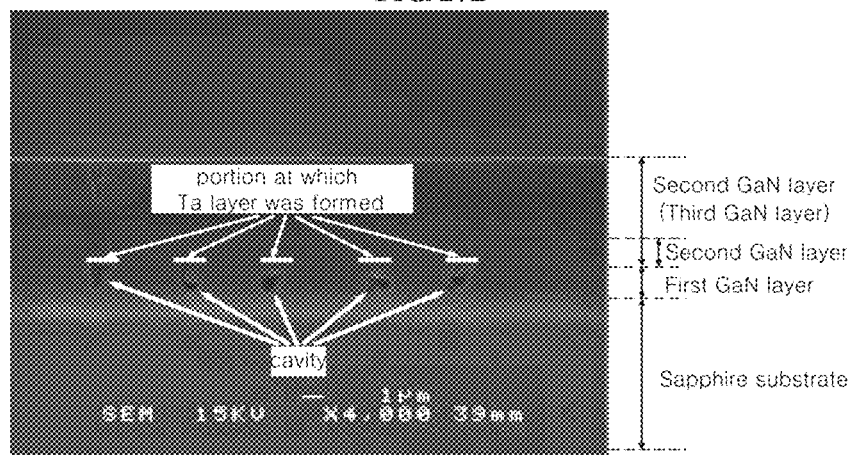
FIG. 27B is a SEM micrograph of a side section of the semiconductor substrate of FIG. 27A, on which the second GaN layer is formed.

Next, referring to FIG. 24A-D, the semiconductor substrate 400, which has an irregular surface and on which the portion of the second GaN layer 404 is formed in FIG. 24A-C, is removed from the MOCVD apparatus, and the surface of the semiconductor substrate 400 is then cleaned using pure water for 15 minutes at 45 kHz by an ultrasound washer (not shown). The Ta layer 403 is removed by this ultrasound cleaning. FIG. 27A is an optical micrograph of the surface of the semiconductor substrate 400, from which the Ta layer 403 is removed. As shown in FIG. 27A, when the Ta layer 403 is removed, the sapphire substrate 401 and the first GaN layer 402 remain on the surface of the semiconductor substrate 400. In the present exemplary embodiment, after the Ta layer 403 is removed, the holes 404a are emptied, allowing the first GaN layer 402 to be seen on the surface of the semiconductor substrate and making the surface of the semiconductor substrate 400 more irregular. Further, the hole (indicated by D in FIG. 27A) emptied by the removal of the Ta layer 403 has a width of 4 μm. In the present exemplary embodiment, the semiconductor substrate 400 is cleaned by ultrasound cleaning with pure water. The semiconductor substrate 400 may also be cleaned by ultrasound cleaning with a solution that is capable of dissolving the Ta layer 403 but is incapable of dissolving the first and second GaN layers 402 and 404. The solution may be water, water and hydrochloric acid, water and sulfuric acid, water and acetic acid, water and hydrofluoric acid, water and sodium hydroxide, water and potassium hydroxide (here, the amount of water is in the range of 0~90%), and the like.

Next, referring to FIG. 24A-E, an additional second GaN layer 404 is formed on the first GaN layer 402 of the semiconductor substrate 400, which has the irregular surface, using the MOCVD apparatus. This additional second GaN layer 404 is formed to a thickness of 4.5 μm by heating at 1040° C. for 1 hour at a pressure of 500 Torr in the MOCVD apparatus while supplying TMG at a flux of flux of 160 μmol/min in the MOCVD apparatus. FIG. 26B shows a side section of the semiconductor substrate which has the additional second GaN layer 404 formed by this process. As shown in FIG. 26B, a cavity is formed at a portion of the first GaN layer 402 under the removed Ta layer 403, and the surface of the second GaN layer 404 becomes flattened. Further, in this process, since the Ta layer is previously removed, the granular materials as described in the first exemplary embodiment are not precipitated on the semiconductor substrate.

Further, in FIG. 24A-C, since the portion of the second GaN layer 404 is formed on the first GaN layer 402, it has no defect. Therefore, an interlayer border is not formed between the portion of the second GaN layer and the additional second GaN layer 404 formed thereon in FIG. 24A-E. Further, the portion of the second GaN layer 404 formed in FIG. 24A-C may be defined as the second GaN layer, and the additional second GaN layer 404 formed in FIG. 24A-E may be defined as a third GaN layer 405. FIG.

24B shows this example. In FIG. 24B, the respective processes shown in FIG. 24B-A to FIG. 24B-E are the same as those of FIG. 24A, and descriptions thereof will be omitted herein. FIG. 24B-E shows a structural difference of the second GaN layer from that shown in FIG. 24A-E. In FIG. 24B-E, a GaN layer formed in the process of FIG. 24B-C is shown as the second GaN layer 404 and a GaN layer formed in the process of FIG. 24B-E is shown as the third GaN layer 405 (third semiconductor layer). In FIG. 24B-E, a border between the second GaN layer 404 and the third GaN layer 405 is indicated by a dotted line. As such, the GaN layers formed on the first GaN layer 402 before and after the cleaning process are formed by substantially the same crystal growth method and have the same structure. However, since they are grown using different processes, the GaN layers formed on the first GaN layer 402 before and after the cleaning process may be referred to as the second and third GaN layers 404 and 405.

Figure 28A:
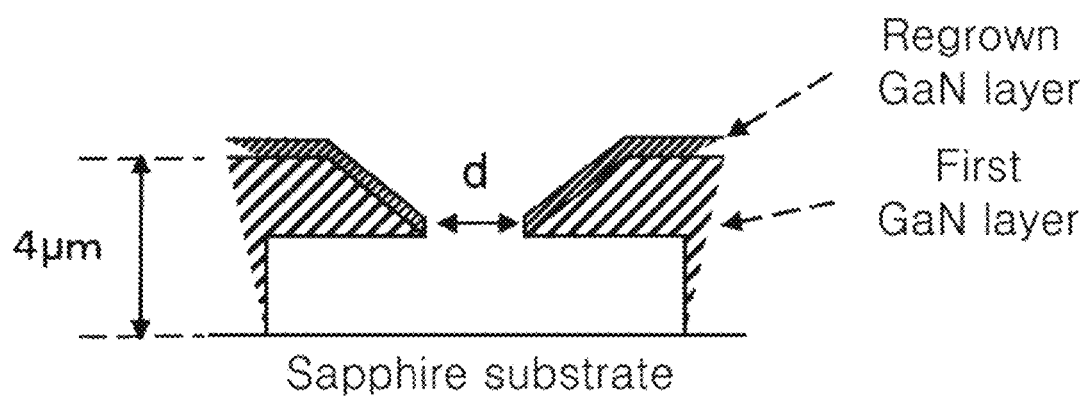
FIG. 28A and FIG. 28B are sectional views of the semiconductor substrate formed by the method in accordance with the third exemplary embodiment, showing a grown state of a GaN layer, in which Figure A shows first GaN layers separated a narrow distance from each other, and Figure B shows first GaN layers separated a wide distance from each other.
Figure 28B:
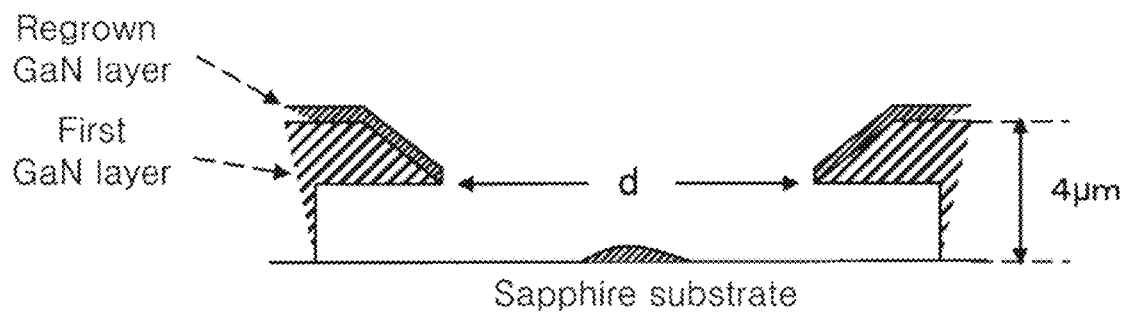
Figure 29A:
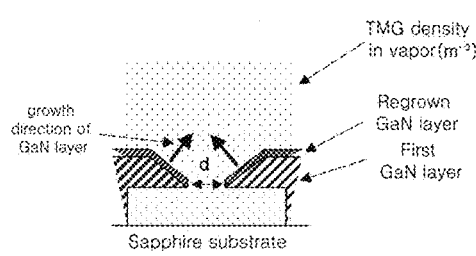
Figure 29B:
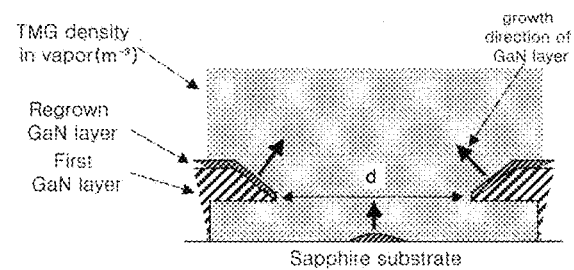
Figure 29C:
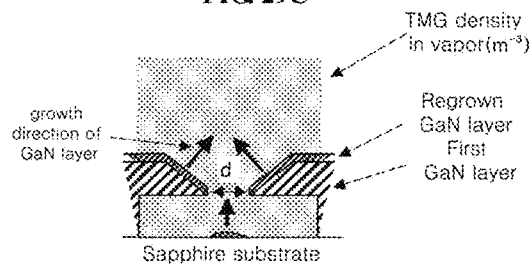
Figure 29D:
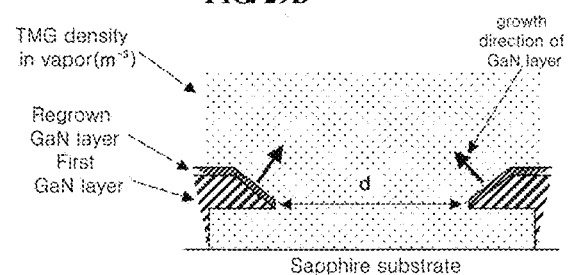

Further, during the formation of the second GaN layer 404 (or third GaN layer 405), the width of the holes 404a formed after removal of the Ta layer 403 and the internal pressure of the MOCVD apparatus influence the formation of the cavity in the first GaN layer 402. This will be described hereinafter with reference to FIGS. 28 and 29. In FIGS. 28 and 29, the width of the holes 404a are indicated by a distance "d" between the first GaN layers 402. FIG. 28A is a sectional view showing a grown state of the GaN layer, in which the distance "d" is relatively small, and FIG. 28B is a sectional view showing a grown state of the GaN layer, in which the distance "d" is relatively large. FIG. 29A is a sectional view showing TMG density in a vapor and a grown state of the GaN layer when the first GaN layers 402 are separated a relatively small distance "d" from each other and the internal pressure "P" of the MOCVD apparatus is relatively low. FIG. 29B is a sectional view showing TMG density in a vapor and a grown state of the GaN layer when the first GaN layers 402 are separated a relatively large distance "d" from each other and the internal pressure "P" of the MOCVD apparatus is relatively high. FIG. 29C is a sectional view showing TMG density in a vapor and a grown state of the GaN layer when the first GaN layers 402 are separated a relatively small distance "d" from each other and the internal pressure "P" of the MOCVD apparatus is relatively high. FIG. 29D is a sectional view showing TMG density in a vapor and a grown state of the GaN layer when the first GaN layers 402 are separated a relatively large distance "d" from each other and the internal pressure "P" of the MOCVD apparatus is relatively low.

First, FIGS. 28A and FIG. 28B will be described. In FIG. 28A and FIG. 28B, when the first GaN layer 402 has a thickness of 4 µm, the distance "d" between the first GaN layer in FIG. 28A is less than 4 µm (d<4 µm), and the distance "d" between the first GaN layer in FIG. 28B is greater than 10 µm (d>10 µm). Such a distance between the first GaN layers 402 depends on the width of the Ta layer 403. For example, when the width of the Ta layer 403 is set to 4 µm in the process of forming the Ta layer 403, the distance between the first GaN layers 402 becomes less than 4 µm due to the hole 404a formed in the first GaN layer 402 after the Ta layer 403 is removed by the ultrasound cleaning, as shown in FIG. 28A. Further, for example, when the width of the Ta layer 403 is set to 10 µm in the process of forming the Ta layer 403, the distance between the first GaN layers 402 becomes greater than 10 µm due to the hole 404a formed in the first GaN layer 402 after the Ta layer 403 is removed by the ultrasound cleaning, as shown in FIG. 28B.

Further, in the process of forming the second GaN layer (or third GaN layer 405) of FIG. 24A-E (or FIG. 24B-E), a growing process of a regrown GaN layer shown in FIG. 28A is different from that shown in FIG. 28B due to the internal pressure of the MOCVD apparatus and the distance "d" between the first GaN layers 402. In both growing processes of the regrown GaN layer shown in FIG. 28A and FIG. 28B, when the internal pressure of the MOCVD apparatus was set to 500 Ton, the GaN layer was not joined to the sapphire substrate of FIG. 28A, but it was joined to the sapphire substrate of FIG. 28B. On the other hand, when the internal pressure of the MOCVD apparatus was set to a pressure less than 500 Torr, for example, 10~100 Torr, the GaN layer was not joined to the sapphire substrate in both cases of FIG. 28A and FIG. 28B. In other words, when the MOCVD apparatus is set to have a relatively low internal pressure, the GaN layer is not joined to the sapphire substrate even in the case of a relatively large distance between the first GaN layers. Further, when the MOCVD apparatus is set to have a relatively high internal pressure, the GaN layer is joined to the sapphire substrate even in the case of a relatively small distance between the first GaN layers.

Next, a relationship between a grown state of the regrown GaN layer and the internal pressure of the MOCVD apparatus and the distance "d" between the first GaN layers will be described with reference to FIG. 29. In FIG. 29A to FIG. 29D, the term "TMG density in a vapor" means the density ($m^{-3}$) of TMG in a vapor, in which TMG is supplied for growing the regrown GaN layer. "TMG density in a vapor" varies depending on the internal pressure of the MOCVD apparatus. When the pressure is set to a relatively low pressure, for example, 10~100 Torr in the MOCVD apparatus, the TMG density ($m^{-3}$) in the vapor is lowered to increase a mean free process of TMG together and a migration length (diffusion length) of the TMG in the GaN layer, thereby retarding the growth of the GaN layer. On the other hand, when the pressure is set to a relatively high pressure, for example, 200~760 Torr in the MOCVD apparatus, the TMG density ($m^{-3}$) in the vapor is increased to reduce the mean free process of TMG and the migration length (diffusion length) of the TMG in the GaN layer, thereby promoting the growth of the GaN layer. Thus, when the first GaN layers are separated at constant intervals "d" from each other, the amount of GaN joined to the sapphire substrate is further lowered by setting the internal pressure of the MOCVD apparatus to a relatively low value. On the other hand, when a silicon substrate is used instead of the sapphire substrate and the supplied amount of TMG is constant, the amount of GaN joined to the sapphire substrate is not changed and does not depend on the internal pressure of the MOCVD apparatus. This result is related to lattice parameters of the GaN layer and the substrate. Further, the arrows shown in FIG. 29A and FIG. 29B indicate growth directions of the GaN layer, and show that the regrown GaN layers are vertically grown with respect to surfaces (top surface and inclined surface) of the first GaN layer 402.

In FIG. 29A, the distance "d" between the first GaN layers 402 is set to a relatively small value (d<4 µm) and the internal pressure "P" of the MOCVD apparatus is set to a relatively low value, for example, 10~100 Torr. In this case, the TMG density ($m^{-3}$) in the vapor is lowered to increase the migration length (diffusion length) of the TMG in the GaN layer, thereby retarding the growth of the GaN layer. As a result, the GaN layer is not joined to the sapphire substrate shown in FIG. 29A. In FIG. 29B, the distance "d" between the first GaN layers 402 is set to a relatively large value (d>10 µm) and the internal pressure "P" of the MOCVD apparatus is set to a relatively high value, for example, 200~600 Torr. In the present exemplary embodiment, the TMG density (m$^{-3}$) in the vapor is increased to shorten the migration length (diffusion length) of the TMG in the GaN layer, thereby promoting the growth of the GaN layer. As a result, the GaN layer is joined to the sapphire substrate shown in FIG. 29B.

Under the conditions of FIG. 29A (that is, the relatively small distance "d" between the first GaN layers and the relatively low internal pressure "P" of the MOCVD apparatus), since joining GaN to the sapphire substrate may be difficult, the hole 404a formed after the removal of the Ta layer 403 is not filled with the regrown GaN layer through growth of the regrown GaN layer, so that the cavity 402a formed in the first GaN layer 402 remains. Further, under the conditions of FIG. 29B (that is, the relatively large distance "d" between the first GaN layers and the relatively high internal pressure "P" of the MOCVD apparatus), since GaN may be easily joined to the sapphire substrate, the hole 404a formed after the removal of the Ta layer 403 is filled with the regrown GaN layer through growth of the regrown GaN layer, so that the cavity 402a formed in the first GaN layer 402 does not remain.

In FIG. 29C, the distance "d" between the first GaN layers 402 is set to a relatively small value (d<4 µm) and the internal pressure "P" of the MOCVD apparatus is set to a relatively high value, for example, 200~600 Torr. In this case, the TMG density (m$^{-3}$) in the vapor is increased to shorten the migration length (diffusion length) of the TMG in the GaN layer, thereby promoting the growth of the GaN layer. As a result, the GaN layer is joined to the sapphire substrate shown in FIG. 29B. In the present exemplary embodiment, the amount of GaN joined to the sapphire substrate is less than the amount of GaN joined to the sapphire substrate shown in FIG. 29B. That is, when the internal pressure of the MOCVD apparatus is set to be relatively high, a relatively small distance "d" between the first GaN layers 402 makes it difficult for GaN to be joined to the sapphire substrate. In FIG. 29D, the distance "d" between the first GaN layers 402 is set to a relatively large value (d>10 µm) and the internal pressure "P" of the MOCVD apparatus is set to a relatively low value, for example, 10~100 Torr. In the present exemplary embodiment, the TMG density (m$^{-3}$) in the vapor is lowered to increase the migration length (diffusion length) of the TMG in the GaN layer, thereby retarding the growth of the GaN layer. As a result, the GaN layer is not joined to the sapphire substrate shown in FIG. 29A.

Under the conditions of FIG. 29C (that is, the relatively small distance "d" between the first GaN layers and the relatively high internal pressure "P" of the MOCVD apparatus), since GaN may be easily joined to the sapphire substrate, the hole 404a formed after the removal of the Ta layer 403 is filled with the regrown GaN layer through growth of the regrown GaN layer. However, since the amount of GaN joined to the sapphire substrate is less than that in the case of the relatively large distance "d" between the first GaN layers, the cavity 402a formed in the first GaN layer 402 is not completely filled therewith. Further, under the conditions of FIG. 29D (that is, the relatively large distance "d" between the first GaN layers and the relatively low internal pressure "P" of the MOCVD apparatus), since joining GaN to the sapphire substrate may be difficult, the hole 404a formed after the removal of the Ta layer 403 is not filled with the regrown GaN layer through growth of the regrown GaN layer, so that the cavity 402a formed in the first GaN layer 402 remains.

As such, it is ascertained that the cavity 402 may remain or not remain in the first GaN layer 403 depending on the growth conditions of GaN, that is, the internal pressure of the MOCVD apparatus and the distance "d" between the first GaN layers 402, as shown in FIG. 29 A to FIG. 29D. Accordingly, it is possible to allow the cavity 402a to remain in the first GaN layer 402 by adjusting the growth conditions of the second GaN layer 404 (or third GaN layer 405) to set a proper distance "d" between the first GaN layers 402 and a proper internal pressure of the MOCVD apparatus.

Next, referring to FIG. 25A-A, the sapphire substrate 401 is separated. Then, referring to FIG. 25A-B, the GaN substrate 400 may be obtained by polishing the first GaN layer 402, from which the sapphire substrate is removed. The GaN substrate 400 may be used as a semiconductor substrate for manufacturing a device by attaching a silicon-based substrate such as Si or SiC to an upper side of the GaN substrate 400 and flattening a lower surface thereof. Furthermore, when the sapphire substrate 401 is separated, the cavity 402a formed in the first GaN layer 102 may be used. Separation of the sapphire substrate 401 may be performed by, for example, a laser lift-off or polishing process. It should be understood that the method of separating the sapphire substrate 101 is not limited to a specific one in this embodiment. Further, in FIG. 25B, FIG. 25B-A shows a process of separating the sapphire substrate 401 from the semiconductor substrate 400 shown in FIG. 24B-E, and 24B-B shows a process of polishing the first GaN layer 402, from which the sapphire substrate is separated. In FIG. 25B-A and FIG. 25B-B, the border between the second GaN layer 404 and the third GaN layer 405 is shown by a dotted line.

As such, in the third exemplary embodiment, when forming the second GaN layer 404 (or third GaN layer 405), a portion of the second GaN layer 404 (or the second GaN layer 404) is first formed by annealing the semiconductor substrate 400 while adjusting the internal pressure of the MOCVD apparatus to be constant by supplying NH$_3$ gas thereto. Then, the semiconductor substrate 400 is removed from the MOCVD apparatus to remove the Ta layer 403 by ultrasound cleaning and is then returned back to the MOCVD apparatus. Then, while adjusting the internal pressure of the MOCVD by supplying TMG to the semiconductor substrate therein, an additional second GaN layer 404 (or third GaN layer 405) is formed, thereby allowing the cavity 402a to be formed in the first GaN layer 402 using a hole, which is formed by removal of the Ta layer 403. Thus, when forming the second GaN layer 404 (or third GaN layer 405) in the third exemplary embodiment, it is possible to form the cavity 402a in the first GaN layer 402 using the hole formed after the removal of the Ta layer by ultrasound cleaning. In other words, the cavity 402a may be formed in the first GaN layer 402 by forming the metallic material layer which permits the formation of the hole at a portion on the first GaN layer 402 as described above. Further, in the semiconductor substrate 400 of the third exemplary embodiment, since the Ta layer 403 is removed by the ultrasound cleaning before the second GaN layer 404 is formed, it is possible to form the second GaN layer 404 having a flat surface without forming a granular material on the surface thereof.

In addition, the MOCVD conditions of the third exemplary embodiment are provided as an example, and thus, may be set to allow the second GaN layer 404 (or third GaN layer 405) and the cavity 402a to be simultaneously formed. Here, since the formation of the cavity 402a depends on the width of the Ta layer 403 and the internal pressure of the MOCVD apparatus during the growth of the second GaN layer 404 (or third GaN layer 405), the width of the Ta layer 403 and the internal pressure of the MOCVD apparatus are adjusted in the third exemplary embodiment.

Further, in the third exemplary embodiment, the shape of the Ta layer 403 is not limited to the aforementioned stripe shape, and may be changed depending on a device structure to be formed on the semiconductor substrate 400. An example of a device formed using the semiconductor substrate 400 will be described below.

Further, the semiconductor substrate 400 of the third exemplary embodiment may be reused as a substrate 401 forming a GaN layer having the aforementioned cavity by separating the GaN substrate and a surface of the sapphire substrate 401 on which a new GaN substrate is formed may be flattened by RIE or the like. Hence, manufacturing costs of the GaN substrate can be further reduced.

In a fourth exemplary embodiment, a light emitting diode (LED) array formed on the semiconductor substrate 100 of the first exemplary embodiment, the semiconductor substrate 300 of the second exemplary embodiment or the semiconductor substrate 400 of the third exemplary embodiment, will be described with reference to FIG. 11.

FIG. 11 is a sectional view of an LED array in accordance with the fourth exemplary embodiment. In FIG. 11, the semiconductor substrate 100 is applied.

Referring to FIG. 11, LEDs 200 are separated from each other on the semiconductor substrate 100. Each LED 200 includes a lower semiconductor layer 201 composed of a first compound semiconductor layer, an active layer 202, and an upper semiconductor layer 203 composed of a second compound semiconductor layer. The lower semiconductor layer 201 and the upper semiconductor layer 203 may comprise the same class as the first GaN layer 102 and the second GaN layer 104. The active layer 202 may have a single or multi-quantum well structure having a barrier layer, and may be formed of a material and composition selected depending on a desired light emitting field. For example, the active layer 202 may be formed of a gallium nitride-based compound semiconductor. The upper and lower semiconductor layers 201 and 203 may be a gallium nitride-based compound semiconductor having a greater band gap than that of the active layer 202.

In the present exemplary embodiment, the lower semiconductor layer 201 on the semiconductor substrate 100 is formed on the second GaN layer 104. Thus, it is possible to reduce manufacturing costs by manufacturing the LEDs 200 using the semiconductor substrate 100.

The upper semiconductor layer 203 is located above a portion of the lower semiconductor layer 201, and the active layer 202 is interposed between the upper semiconductor layer 203 and the lower semiconductor layer 201. Further, an upper electrode layer 204 may be formed on the upper semiconductor layer 203. The upper electrode layer 204 may be a transparent electrode layer formed of, for example, indium tin oxide (ITO), Ni/Au, and the like.

Further, an upper electrode pad 205 is formed on the upper electrode layer 204 and a lower electrode 207 is formed on an exposed region of the lower semiconductor layer 201.

After the LEDs 200 are formed on the single semiconductor substrate 100 in this manner, the LEDs 200 are divided into individual LEDs 200 by cutting a portion of the semiconductor substrate 100 between the LEDs 200. In the LED of this embodiment, the upper electrode 205 and the lower electrode pad 207 are laterally arranged, but an LED may be manufactured to have vertically arranged electrodes. In other words, a vertical type LED may be manufactured by separating the sapphire substrate 101 using the cavity 102a of the semiconductor substrate 100, flattening the separated surface of the first GaN layer 102 by RIE or the like, and forming an upper electrode pad 205 and a lower electrode pad 207.

As such, it is possible to reduce manufacturing costs of the LEDs by manufacturing the LEDs 200 using the semiconductor substrate 100 or 300. Further, when forming the LEDs 200 on the second GaN layer 104, it is possible to construct an LED array with improved light emitting efficiency and high brightness by forming the compound semiconductors such that the second GaN layer 104 and the lower semiconductor layer 201 have different indices of refraction from each other. Further, when a laser diode is formed using the GaN substrate 100 or 300, from which the sapphire substrate 101 is separated, it is possible to achieve an improvement in heat dissipation properties together with long lifetime of the laser diode, since the laser diode is formed on the GaN layer 104, which exhibits better thermal conductivity than the sapphire substrate 101.

In the fourth exemplary embodiment, the LEDs 200 are formed on the second GaN layer of the semiconductor substrate 100 or 300. Alternatively, the LEDs 200 may be formed in the same manner using the GaN substrate which is separated from the sapphire substrate 101. In addition, a semiconductor device, such as an FET and the like, may be formed by attaching a silicon-based substrate, such as Si or SiC, as an indication material, to a separated surface of the GaN substrate, which is separated from the sapphire substrate 101, and polishing the separated surface of the GaN substrate by RIE or the like. In this case, a high-current device can be manufactured.

Therefore, the semiconductor substrate 100 or 300 is used to manufacture semiconductor devices such as LEDs or laser diodes, thereby facilitating manufacture of high performance semiconductor devices at low cost without using an expensive GaN substrate.

Further, in the first, second, and third exemplary embodiments, the Ta layer, Ti layer and Cr layers are formed as the metallic material layer. However, any metal alloy, alloys of metals and semiconductors, or any metallic material capable of providing an etching phenomenon to the first GaN layer may also be used, such as those discussed in Hasegawa and Haino.

As apparent from the above description, according to the exemplary embodiments, it is possible to provide a method of manufacturing a flat and easily separable GaN substrate on a heterogeneous substrate at low cost. It is also possible to realize performance improvement and long operational lifespan of semiconductor devices, such as LEDs or laser diodes, which are manufactured using the GaN substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor substrate, the method comprising:
   forming a first layer on a substrate;
   patterning the first layer to form a plurality of patterns spaced apart from one another;
   forming a second layer on the patterns to cover the entire upper surface of each of the patterns;

heat-treating the second layer to form cavities in the patterns between the second layer and the substrate; and growing the second layer covering the cavities.

2. The method of claim 1, wherein heat-treating the second layer comprises heat-treating the second layer at a temperature greater than 900° C.

3. The method of claim 1, wherein the second layer further comprises at least one of gallium and nitrogen.

4. The method of claim 3, wherein the second layer further comprises aluminum.

5. The method of claim 1, wherein the substrate comprises at least one of a sapphire substrate and a silicon-based substrate.

6. The method of claim 1, wherein the first layer comprises at least one of titanium and tantalum.

7. The method of claim 6, wherein the first layer further comprises oxygen.

8. A method of manufacturing a semiconductor substrate, the method comprising:

forming a first layer on a substrate;

patterning the first layer to form a plurality of patterns spaced apart from one another;

forming a second layer on the patterns to cover each of the patterns;

heat-treating the second layer to form cavities in the patterns between the second layer and the substrate; and growing the second layer covering the cavities, wherein a cross-sectional view of the patterns has substantially a semi-spherical shape.

9. The method of claim 8, wherein the substrate comprises at least one of a sapphire substrate and a silicon-based substrate.

10. The method of claim 8, wherein the first layer comprises at least one of titanium and tantalum.

11. A method of manufacturing a semiconductor substrate, the method comprising:

forming a first layer on a substrate;

patterning the first layer to form a plurality of patterns spaced apart from one another;

forming a second layer on the patterns to cover each of the patterns;

heat-treating the second layer to form cavities in the patterns between the second layer and the substrate; and growing the second layer covering the cavities, wherein the cavities are directly formed on the substrate.

12. The method of claim 11, wherein the substrate comprises at least one of a sapphire substrate and a silicon-based substrate.

13. The method of claim 11, wherein the first layer comprises at least one of titanium and tantalum.

14. A method of manufacturing a semiconductor substrate, the method comprising:

forming a first layer on a substrate;

patterning the first layer to form a plurality of patterns spaced apart from one another;

forming a second layer on the patterns to cover each of the patterns;

heat-treating the second layer to form cavities in the patterns between the second layer and the substrate; and growing the second layer covering the cavities, wherein at least portions of the patterns evaporate through a first portion of the second layer.

15. The method of claim 14, wherein the substrate comprises at least one of a sapphire substrate and a silicon-based substrate.

16. The method of claim 14, wherein the first layer comprises at least one of titanium and tantalum.

17. A method of manufacturing a semiconductor substrate, the method comprising:

forming a first layer on a substrate;

patterning the first layer to form a plurality of patterns spaced apart from one another;

forming a second layer on the patterns to cover each of the patterns;

heat-treating the second layer to form cavities in the patterns between the second layer and the substrate, and to crystalize the second layer at a first temperature; and growing the second layer covering the cavities.

18. The method of claim 17, wherein the substrate comprises at least one of a sapphire substrate and a silicon-based substrate.

19. The method of claim 17, wherein the first layer comprises at least one of titanium and tantalum.

* * * * *